United States Patent
Golshany et al.

(10) Patent No.: US 9,965,582 B2
(45) Date of Patent: May 8, 2018

(54) SYSTEMS AND METHODS FOR DETERMINING SIZES AND SHAPES OF GEODESIC MODULES

(71) Applicant: THE BOEING COMPANY, Chicago, IL (US)

(72) Inventors: Sina Golshany, Lynnwood, WA (US); Junghyun Ahn, Seattle, WA (US); Derek Alderks, Mill Creek, WA (US); Todd William Erickson, Fife, WA (US)

(73) Assignee: The Boeing Company, Chicago, IL (US)

( * ) Notice: Subject to any disclaimer, the term of this patent is extended or adjusted under 35 U.S.C. 154(b) by 325 days.

(21) Appl. No.: 14/840,802

(22) Filed: Aug. 31, 2015

(65) Prior Publication Data

US 2017/0061068 A1    Mar. 2, 2017

(51) Int. Cl.
G06F 19/00    (2018.01)
B64C 1/00    (2006.01)
B64D 7/00    (2006.01)
G06F 17/50    (2006.01)

(52) U.S. Cl.
CPC .......... *G06F 17/5095* (2013.01); *G06F 17/50* (2013.01)

(58) Field of Classification Search
CPC ...................................................... G06T 17/00
USPC ....................................................... 700/145
See application file for complete search history.

(56) References Cited

U.S. PATENT DOCUMENTS

| | | | |
|---|---|---|---|
| 1,894,011 A | 1/1933 | Wallis | |
| 1,985,649 A | 12/1934 | Wallis | |
| 2,060,387 A | 11/1936 | Wallis | |
| 2,157,042 A * | 5/1939 | Wallis | B64C 3/18 244/117 R |
| 3,462,893 A | 8/1969 | Kaiser | |
| 3,488,901 A | 1/1970 | Peterschmidt | |
| 3,803,794 A | 4/1974 | Luckey | |
| 4,052,025 A | 10/1977 | Clark | |
| 4,086,378 A | 4/1978 | Kam | |

(Continued)

OTHER PUBLICATIONS

Edwards et al, A Forebody Design Technique for Highly Integrated Bottom-Mounted Scramjets With Application to a Hypersonic Research Airplane, Dec. 1976, National Aeronautics and Space Administration, pp. 32.*

(Continued)

*Primary Examiner* — Suresh Suryawanshi
(74) *Attorney, Agent, or Firm* — Joseph M. Butscher; The Small Patent Law Group, LLC

(57) ABSTRACT

A system and method determine a size and a shape for identical geodesic modules that are used to form a structure. The system and method may include analyzing input data regarding a size and a shape of the structure to be formed, and determining the size and the shape for each of the identical geodesic modules based on the size and the shape of the structure to be formed. The structure may include a framework including the identical geodesic modules. Each of the geodesic modules has a size and a shape that are the same as all of the other of the geodesic modules. A forming system and method position a framework and a covering skin of the structure in relation to a mandrel, and drill and rivet the framework to the covering skin with a plurality of operating heads.

23 Claims, 12 Drawing Sheets

(56) References Cited

U.S. PATENT DOCUMENTS

| | | |
|---|---|---|
| 4,194,327 A | 3/1980 | Simone |
| 4,230,293 A | 10/1980 | Hamm |
| 4,262,461 A | 4/1981 | Johnson |
| 4,278,485 A | 7/1981 | Hamm |
| 4,308,698 A | 1/1982 | Fleishman |
| RE33,785 E | 12/1991 | Hildebrandt |
| 5,097,640 A | 3/1992 | Skolnick |
| 5,200,251 A | 4/1993 | Brand |
| 5,823,468 A | 10/1998 | Bothe |
| 5,871,117 A | 2/1999 | Protasov |
| 5,996,288 A | 12/1999 | Aiken |
| 6,050,315 A | 4/2000 | Deckers |
| 6,068,902 A | 5/2000 | Vasiliev |
| 6,149,851 A | 11/2000 | Deckers |
| 6,290,799 B1 | 9/2001 | Deckers |
| 6,343,452 B1 | 2/2002 | Holden |
| 6,350,115 B1 | 2/2002 | Sloman |
| 6,458,309 B1 | 10/2002 | Allen |
| 6,527,223 B1 | 3/2003 | Mondale |
| 6,581,892 B2* | 6/2003 | Carnevali ............ F16C 11/0604 248/181.1 |
| 6,622,447 B1 | 9/2003 | Kessler |
| 6,655,633 B1 | 12/2003 | Chapman, Jr. |
| 6,658,800 B2* | 12/2003 | Monson ................ E04B 1/3211 52/81.1 |
| 6,701,691 B1 | 3/2004 | Niiduma |
| 6,748,712 B2 | 6/2004 | Likozar |
| 7,166,251 B2 | 1/2007 | Blankinship |
| 7,282,107 B2* | 10/2007 | Johnson ................. B29C 53/70 156/169 |
| 7,897,239 B2 | 3/2011 | Koon |
| 8,313,600 B2 | 11/2012 | Wilson |
| 8,444,900 B2 | 5/2013 | Wilson |
| 8,511,609 B2 | 8/2013 | Landmann |
| 8,590,216 B1 | 11/2013 | Hurt, III |
| 8,694,284 B2* | 4/2014 | Berard .................... G06T 17/30 345/419 |
| 8,844,108 B2 | 9/2014 | Miller |
| 2002/0166294 A1 | 11/2002 | Rogers |
| 2005/0039843 A1 | 2/2005 | Johnson |
| 2006/0192048 A1 | 8/2006 | Pedretti |
| 2007/0095982 A1 | 5/2007 | Kismarton |
| 2008/0066393 A1 | 3/2008 | Sorensen |
| 2009/0152391 A1 | 6/2009 | McWhirk |
| 2009/0277994 A1 | 11/2009 | Lobato |
| 2010/0095605 A1 | 4/2010 | Bellcofski |
| 2010/0139202 A1 | 6/2010 | Athan |
| 2010/0201600 A1 | 8/2010 | Kaneff |
| 2010/0233421 A1* | 9/2010 | Lind ........................ E04B 1/19 428/108 |
| 2011/0164438 A1 | 7/2011 | Schneider |
| 2012/0009372 A1 | 1/2012 | Meyer |
| 2012/0060431 A1 | 3/2012 | Bellcofski |
| 2012/0180405 A1 | 7/2012 | Drake |
| 2012/0204496 A1 | 8/2012 | McSweeney |
| 2013/0014367 A1 | 1/2013 | Miller |
| 2013/0146703 A1 | 6/2013 | Pecnik |
| 2016/0275206 A1* | 9/2016 | Yu ............................ G06F 17/50 |
| 2017/0210458 A1* | 7/2017 | Tothill ..................... B64C 1/12 |

OTHER PUBLICATIONS

"Geodeteics on the Grand Scale—A Detailed Description of the Vickers-Armstrongs Welling I: Exceptional Range and Large Bomb Capacity: Ingenious Structural Features," Flight, Jul. 6, 1939.

* cited by examiner

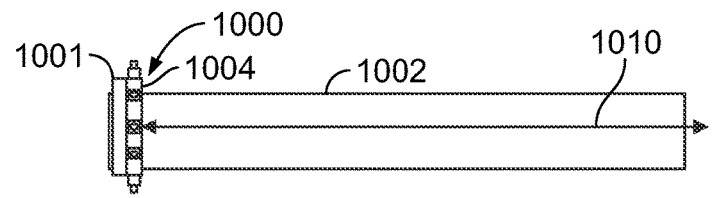
FIG. 15
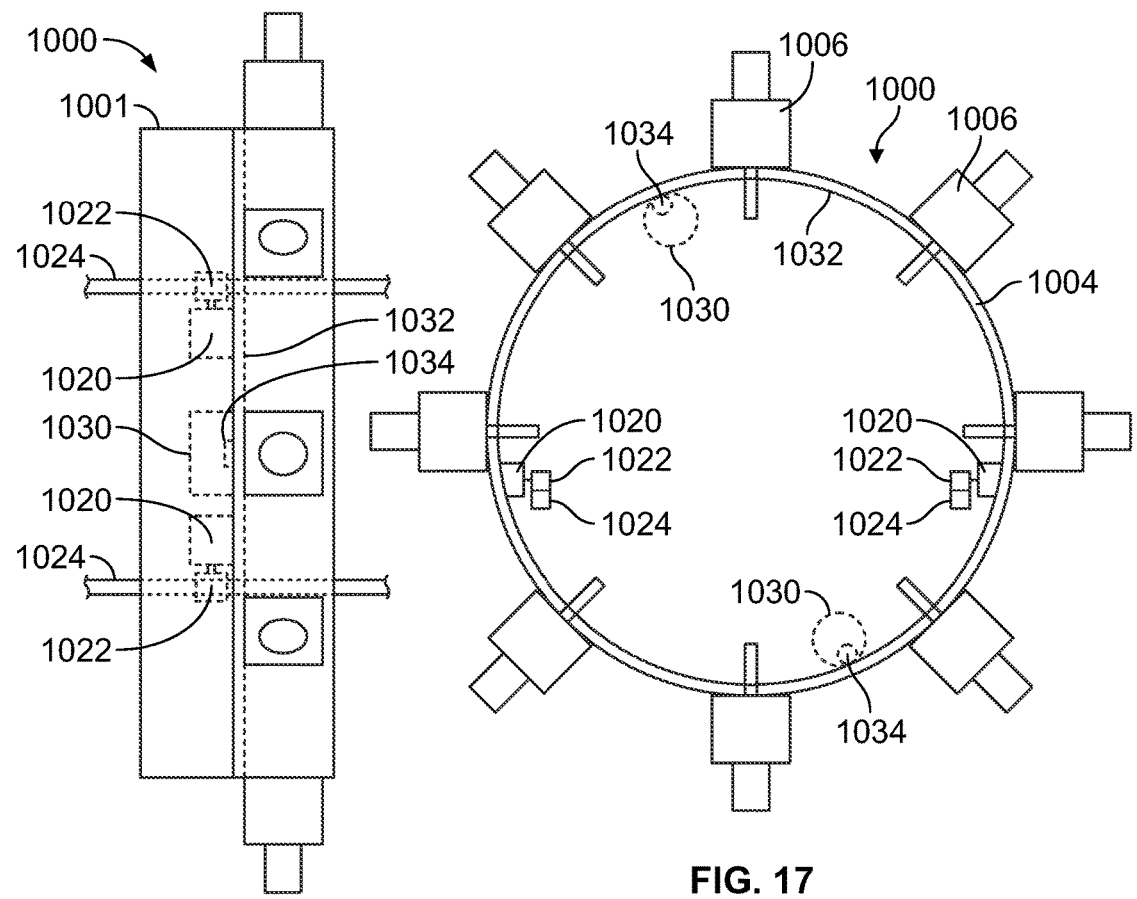
FIG. 16
FIG. 17

SYSTEMS AND METHODS FOR DETERMINING SIZES AND SHAPES OF GEODESIC MODULES

FIELD OF THE DISCLOSURE

Embodiments of the present disclosure generally relate to systems and methods for manufacturing a tubular structure, such as a portion of a fuselage of a vehicle, and, more particularly, to systems and methods for forming (for example, assembling) a constant section of a fuselage of a vehicle.

BACKGROUND OF THE DISCLOSURE

Various vehicles are formed through numerous components. For example, a fuselage of an aircraft may be formed through various stringers, frames, bulkheads, keel beams, and the like that are secured together through numerous fasteners, such as rivets. As can be appreciated, the process of forming the fuselage section is time and labor intensive.

Geodesic airframes have also been used to form fuselages. Known geodesic airframes have a variable (that is, non-constant) cross-section throughout. Accordingly, every separate and distinct element of known geodesic airframes has a unique and distinct shape. Consequently, a large number of geodesic parts, each or nearly each of which is different, are stored and assembled together. As such, the process of locating and assembling such a large number of separate and distinct parts is complicated, time-consuming, and labor-intensive. In short, the assembly process is akin to a large puzzle, in which a large number of unique parts are located and connected together.

Additionally, the process of assembling semi-monocoque structures (such as a fuselage of an airframe) is typically manually performed with fixed jigs. Due to the repetitive nature of such an assembly process, and the small tolerances involved, the assembly of a semi-monocoque structure is time and labor intensive.

Accordingly, a need exists for an efficient system and method of manufacturing a fuselage of a vehicle.

SUMMARY OF THE DISCLOSURE

Certain embodiments of the present disclosure provide a structure that may include a framework including a plurality of identical geodesic modules. Each of the identical geodesic modules has a size and a shape that are the same as all of the other of the plurality of identical geodesic modules. The framework may be a framework for a constant section. The constant section includes a constant curvature and constant cross-sectional radius between opposed circular ends. For example, the constant section may be a cylinder having a constant circular cross-section throughout.

Each of the identical geodesic modules may include a plurality of interconnected frame segments that are identical in size and shape. The interconnected frame segments may include four interconnected frame segments defining a geodesic area therebetween. At least one feature is configured to fit within the geodesic area. For example, the feature may include a window (such as a cabin window within a fuselage of an aircraft). The geodesic area may be diamond shaped.

The structure may also include a covering skin that is secured over the framework. The framework may form at least a portion of a fuselage of an aircraft. In at least one other embodiment, the framework may form at least a portion of a marine vessel or a land-based vehicle. In at least one other embodiment, the framework may form at least a portion of a fixed land-based structure.

Certain embodiments of the present disclosure provide a method of forming a structure. The method may include providing a plurality of identical geodesic modules. Each of the plurality of geodesic modules has a size and a shape that are the same as all of the other of the plurality of identical geodesic modules. The method may also include connecting the plurality of identical geodesic modules together to form a framework. The method may also include accommodating at least one feature within the geodesic area.

Certain embodiments of the present disclosure provide a geodesic module determination system configured to determine a size and a shape for a plurality of identical geodesic modules that are used to form a structure. The geodesic module determination system may include a control unit that executes a set of instructions stored in at least one memory to analyze input data regarding a size and a shape of the structure to be formed, and determine the size and the shape for each of the identical geodesic modules based on the size and the shape of the structure to be formed.

The control unit may execute the set of instructions stored in the at least one memory to account for one or more features to be formed on or in the structure, and determine the size and the shape for each of the plurality of identical geodesic modules based on the size and the shape of the structure to be formed and the feature(s) to be formed on or in the structure. The feature(s) may include one or more windows to be formed in the structure.

In at least one embodiment, the control unit executes the set of instructions stored in the memory to generate a plurality of seed nodes on opposed end circles, generate mirror image geodesic curves between corresponding pairs of the seed nodes of the opposed end circles, and determine the size and shape for each of the plurality of identical geodesic modules based on the geodesic curves and intersections between the geodesic curves. The control unit may generate the plurality of seed nodes based, at least in part, on a size and number of features to be formed on or in the structure and a predetermined structural integrity of the structure. In at least one embodiment, the control unit determines a location of at least one of the seed nodes using an offset angle and a spread angle. The offset angle provides a radial angle with respect to a waterline zero plane, and the spread angle is a constant angle between neighboring seed nodes.

The geodesic module determination system may also include the at least one memory coupled to the control unit, a user interface coupled to the control unit, and a display. The user interface allows an individual to enter data into the system. The display may show representations of the framework and geodesic modules.

Certain embodiments of the present disclosure provide a method of determining a size and a shape for a plurality of identical geodesic modules that are used to form a structure. The method may include analyzing input data regarding a size and a shape of the structure to be formed, and determining the size and the shape for each of the plurality of identical geodesic modules based on the size and the shape of the structure to be formed. The method may also include accounting for one or more features to be formed on or in the structure, and determining the size and the shape for each of the identical geodesic modules based on the size and the shape of the structure to be formed and the feature(s) to be formed on or in the structure.

Certain embodiments of the present disclosure provide a system for forming a structure. The system may include a mandrel, and a plurality of operating heads that drill and/or rivet one or both of a framework or a covering skin of the structure.

In at least one embodiment, the system may include an actuator, and a central axle coupled to the actuator and the mandrel. The actuator is configured to rotate the mandrel through rotation of the axle. The framework and the covering skin are positioned on the mandrel.

In at least one embodiment, the operating heads are moveably secured on a plurality of rails. The operating heads are configured to linearly move in relation to the mandrel on the rails. The number of the operating heads on the rails may equal a number of seed nodes generated by a geodesic module determination system. Optionally, the number of operating heads may equal an even multiple of the number of seed nodes.

In at least one embodiment, the mandrel is selectively moved into and out of a forming chamber proximate to the operating heads. The mandrel is removed from the forming chamber in response to the framework being fully secured to the covering skin.

The mandrel may include a plurality of pads that are moveable between deployed and retracted positions. The pads securely retain the framework and the covering skin in the deployed position, and allow the framework and the covering skin to be removed from the mandrel in the retracted position.

In at least one embodiment, the system may include a tool ring that retains the plurality of operating heads. The tool ring is rotatable with respect to the mandrel and the structure. The tool ring and/or the mandrel may be linearly translatable over an outer surface of the structure. For example, the mandrel may be fixed in position, and the tool ring may be moveably secured to the mandrel through one or more racks.

Certain embodiments of the present disclosure provide a method for forming a structure. The method may include positioning a framework and a covering skin of the structure in relation to a mandrel, and drilling and riveting the framework to the covering skin with a plurality of operating heads.

BRIEF DESCRIPTION OF THE DRAWINGS

FIG. 15 illustrates a diagrammatic representation of a lateral view of a constant section forming system moveably secured on a constant section, according to an embodiment of the present disclosure.

FIG. 16 illustrates a diagrammatic representation of a lateral view of a constant section forming system, according to an embodiment of the present disclosure.

FIG. 17 illustrates a diagrammatic representation of an end view of a constant section forming system, according to an embodiment of the present disclosure.

DETAILED DESCRIPTION OF THE DISCLOSURE

Figure 1:
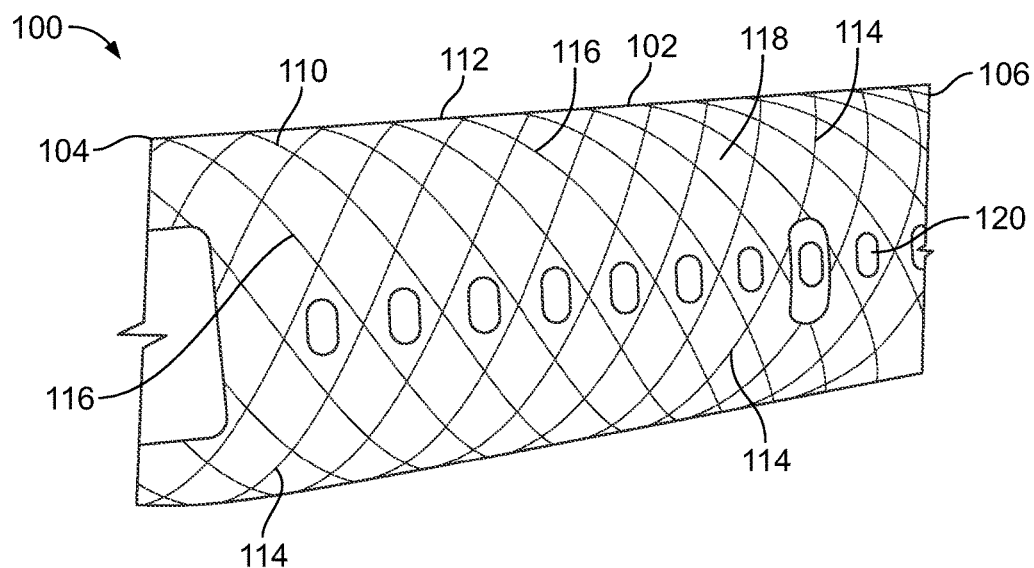
FIG. 1 is a diagrammatic representation of a perspective view of a constant section of a fuselage, according to an embodiment of the present disclosure.

The foregoing summary, as well as the following detailed description of certain embodiments will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Certain embodiments of the present disclosure provide systems and methods of manufacturing a portion of a vehicle. For example, certain embodiments of the present disclosure may be used to form a constant section of a fuselage of an aircraft. The systems and methods are used to form constant sections that include a constant curvature between opposite ends. For example, the constant section may have a circular cross-section throughout. The constant section may be configured to join a fore body (which may include a cockpit) to an aft body (which may include an empennage) of an aircraft. The constant section may define an internal cabin space into which a floor, stowage areas, passenger seats, and the like are to be located.

Embodiments of the present disclosure may include a constant section that may be formed from a plurality of geodesic modules, each of which has the same shape and size. Each geodesic module may be formed from frame segments, each of which has the same shape and size. The geodesic modules are self-similar in that each has the same size and shape as all other geodesic modules used to form the constant section. A geodesic area between frame segments that define a geodesic module has a particular size and shape (such as a geodesic diamond shape) that is the same for each geodesic module. In short, no two geodesic modules that are used to form the constant section differ from one another in size and shape, thereby simplifying a manufacturing process (as unique components do not need to be located and secured together).

As noted, each frame segment that is used to form a geodesic module may have the same size and shape. In at least one embodiment, four identical frame segments are used to form a single geodesic module. Instead of storing hundreds or thousands of different shaped frame segments, a single type of frame segment may be used to form all of the geodesic modules. As such, a manufacturer does not need to locate different types of frame segments and align them in a precise manner (akin to a puzzle) to form the constant section. Instead, all of the frame segments are identical to one another. In this manner, the manufacturing process is streamlined.

Embodiments of the present disclosure provide a significant reduction in weight of a constant section. For example, it has been found that geodesic frames are able to withstand torsion loads better than standard orthogonal structures. As such, a lighter, but stronger, geodesic frame may be used in place of heavier, orthogonal structures. Moreover, the identical geodesic modules that form the constant section provide a regular, repeating pattern over a length of the constant section. The self-repeating pattern reduces a number of fasteners (such as rivets) that are used to secure components together (in contrast to previous structures that were formed through orthogonal connections between stringers, frames, and the like). The geodesic modules form a constant section of a fuselage that uses less material, and is therefore lighter, as compared to previous known fuselages. The resulting lighter and stronger airframe reduces fuel consumption and, therefore, costs of flights. It has been found, for example, that embodiments of the present disclosure provide at least a 7% reduction in weight, and at least a 30% reduction in length of run for riveting for an aluminum constant section of a fuselage of an aircraft.

While embodiments of the present disclosure are described with respect to constant sections of aircraft fuselages, embodiments of the present disclosure may be used with various other vehicles, structures, and devices. For example, embodiments of the present disclosure may be used to form fuselage portions of marine vehicles (such as submarines), space launch vehicles, land-based vehicles, and the like. Additionally, embodiments of the present disclosure may be used to form constant sections of fixed structures, such as buildings. As an example, embodiments of the present disclosure may be used to form various sections of buildings, whether vertically or horizontally oriented, through a plurality of geodesic modules.

At least one embodiment of the present disclosure provides a cylindrical structure that may include a structural framework having a plurality of identical structural frames joined to each other to form a plurality of identical geodesic modules, each of which may include a geodesic diamond shape. The structural framework may follow a geodesic geometry about a center line of the structure. The cylindrical structure may be a constant section, such as that of a fuselage of an aircraft, a hull of a marine vessel, a cabin of a land-based vehicle, a fixed structure (such as a building), and/or the like.

Certain embodiments of the present disclosure provide systems and methods for assembling geodesic modules together to form a unitary constant section, such as a portion of a fuselage of an aircraft. Certain embodiments of the present disclosure provide a system that may include a cylindrical assembly (such as a mandrel) that ejects or otherwise outputs geodesic modules, which may then be affixed to a forming jig.

Certain embodiments of the present disclosure provide a system, which may include a dual function drilling and riveting tool moveably supported on one or more rails along a length of a mandrel, which hold the geodesic modules and body skin panels in place, such as through pneumatic suction, hydraulic or pneumatic latches, and/or the like. The mandrel may be fixed in position, or may be configured to translate and/or revolve about a longitudinal axis. Rails can be positioned on both sides of fuselage panels to allow single or double-sided riveting processes. Optionally, one sided flush head riveting may be used. Motion control of an operating head is drastically simplified due to the motion being limited by the support rails, the angle of the fuselage barrel, and/or the drill-rivet head assembly.

FIG. 1 is a diagrammatic representation of a perspective view of a constant section 100 of a fuselage 102, according to an embodiment of the present disclosure. The constant section 100 includes an axial cross-section that is the same throughout a length of the constant section 100 from a first or front end 104 to a second or rear end 106.

Figure 2:
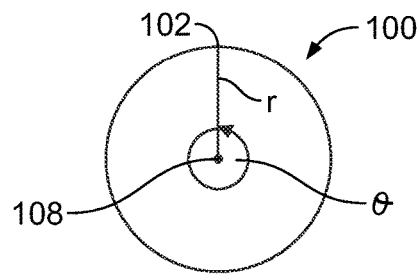
FIG. 2 is a diagrammatic representation of an end view of a constant section of a fuselage, according to an embodiment of the present disclosure.

FIG. 2 is a diagrammatic representation of an end view of the constant section 100 of the fuselage 102, according to an embodiment of the present disclosure. The radius r from a central longitudinal axis 108 that extends through the length of the constant section 100 is the same over an entire 360 degree angle θ at any point along the length of the constant section 100. As such, the constant section 100 may form a cylindrical tube having a constant circular cross-section throughout a length from the first end 104 to the second end 106 (shown in FIG. 1).

Referring again to FIG. 1, the constant section 100 may be formed through a structural framework 110 that is covered by a covering skin 112. The framework 110 may be formed of composite materials, metallic materials, and/or the like. Similarly, the covering skin 112 may be formed from composite materials, metallic materials, and/or the like. The structural framework 110 is first formed, and then the covering skin 112 is secured around the structural framework 110.

The structural framework 110 is formed by a plurality of geodesic modules 114. Each of the geodesic modules 114 may have a common size and shape. In at least one other embodiment, each of the geodesic modules 114 may have a common shape, but the thickness of portions of the geodesic modules may differ. Therefore, all of the geodesic modules 114 used to form the structural framework 110 are self-similar. That is, the size and shape of each geodesic module 114 is identical (or virtually identical). No two of the geodesic modules 114 differ in size and shape.

Each geodesic module 114 is formed from a plurality of frame segments 116. Each frame segment 116 is identical in size and shape. Thus, a plurality of identical frame segments 116 are used to form the geodesic modules 114. As shown, each geodesic module 114 may be formed from four identical frame segments 116 to define a geodesic area 118 therebetween. The geodesic area 118 may be a geodesic diamond shape. Alternatively, the geodesic modules 114 may be formed from more or less than four frame segments 116. For example, a geodesic module 114 may be formed from three frame segments 116 to define a geodesic triangle shape therebetween.

As shown, the geodesic modules 114 are sized and shaped to accommodate one or more structural features that may be formed through the constant section 100. For example, the geodesic modules 114 are sized and shaped to allow for a window 120 to be formed within the geodesic areas 118 defined between frame segments 116. The size and shape of the geodesic modules 114 may be determined through a geodesic module determination system, as described below.

Figure 3:
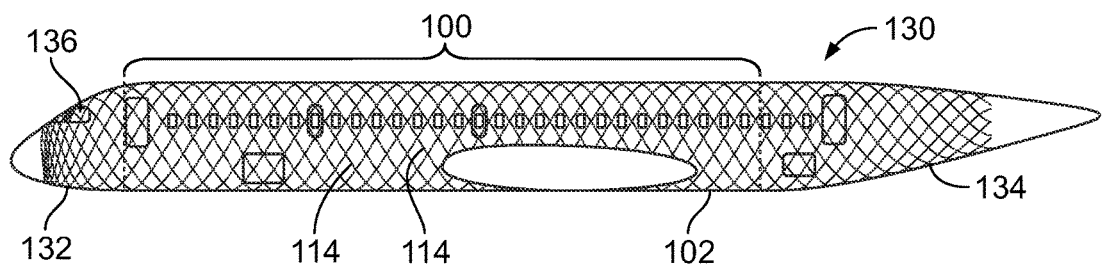
FIG. 3 is a diagrammatic representation of a lateral view of a fuselage of an aircraft, according to an embodiment of the present disclosure.

FIG. 3 is a diagrammatic representation of a lateral view of the fuselage 102 of an aircraft 130, according to an embodiment of the present disclosure. The fuselage 102 may include the constant section 100 disposed between a fore end 132 and an aft end 134. The fore end 132 may include a cockpit 136. The constant section 100 may define a majority of a passenger cabin area. As shown, the fore and aft ends 132 and 134 may be formed from geodesic members of varying shapes and sizes due to varying or non-constant axial cross-sections. While shown as an aircraft, the constant section 100 formed from identically sized and shaped geodesic modules 114 may be used to form various other vehicles, structures, and the like. For example, the geodesic modules 114 may be used to form a hull of a marine vessel (such as a submarine), a land-based vehicle (such as a train, automobile, or the like), various other aerospace vehicles, and the like.

Figure 4:
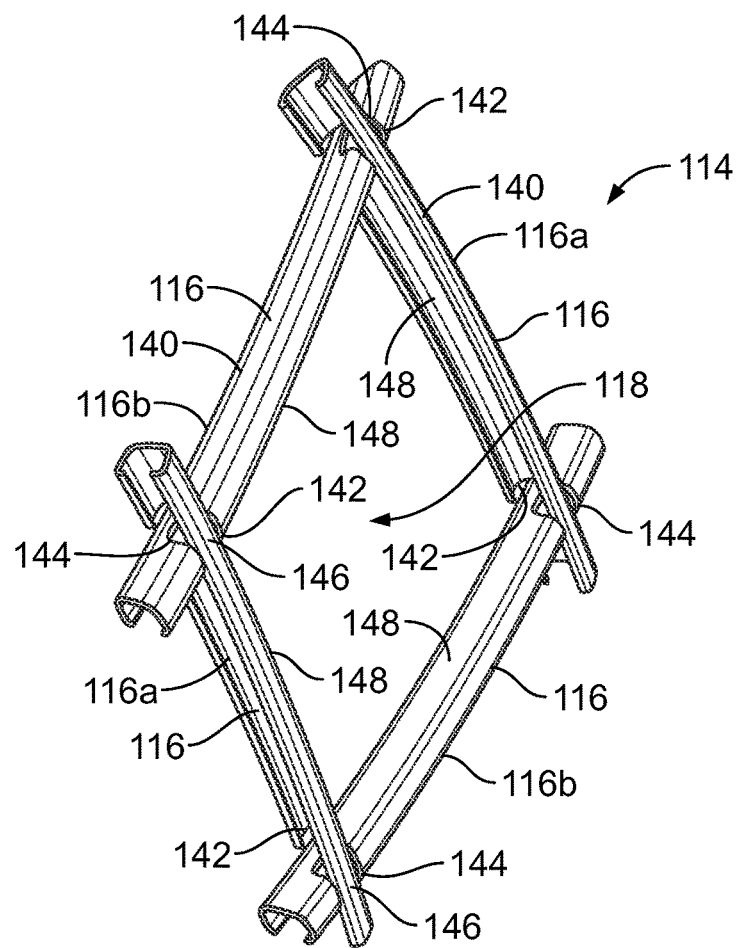
FIG. 4 is a diagrammatic representation of a perspective outer view of a geodesic module, according to an embodiment of the present disclosure.

FIG. 4 is a diagrammatic representation of a perspective outer view of a geodesic module 114, according to an embodiment of the present disclosure. The geodesic module 114 may be formed by four frame segments 116, each of which is identical in size and shape. Each frame segment 116 may include a rail 140 having an identical length and curvature. A connection channel 142 is formed proximate to each end of a frame segment 116. The connection channel 142 is configured to mate with a connection channel 142 of another frame segment 116 to form a connection joint 144 therebetween. Fasteners 146 (such as rivets) may be used to securely connect the frame segments 116 together. Opposed end frame segments 116*a* may be parallel to one another, while opposed lateral segments 116*b* may be parallel to one another.

The geodesic area 118 is formed between interior surfaces 148 of the joined frame segments 116. As shown in FIG. 4, the geodesic area 118 may be a geodesic diamond shape.

Each geodesic module 114 may be securely fixed to another geodesic module 114. For example, terminal ends of each frame segment 116 may be securely fixed to terminal ends of frame segments 116 of a neighboring geodesic module 114. In at least one other embodiment, each frame segment 114 may extend a distance longer than shown. In such an embodiment, multiple geodesic modules 114 may be formed through interconnecting frame segments 116. The frame segments 116 may be longer or shorter than shown. In at least one embodiment, a plurality of joints may be formed along each frame segment 116.

Figure 5:
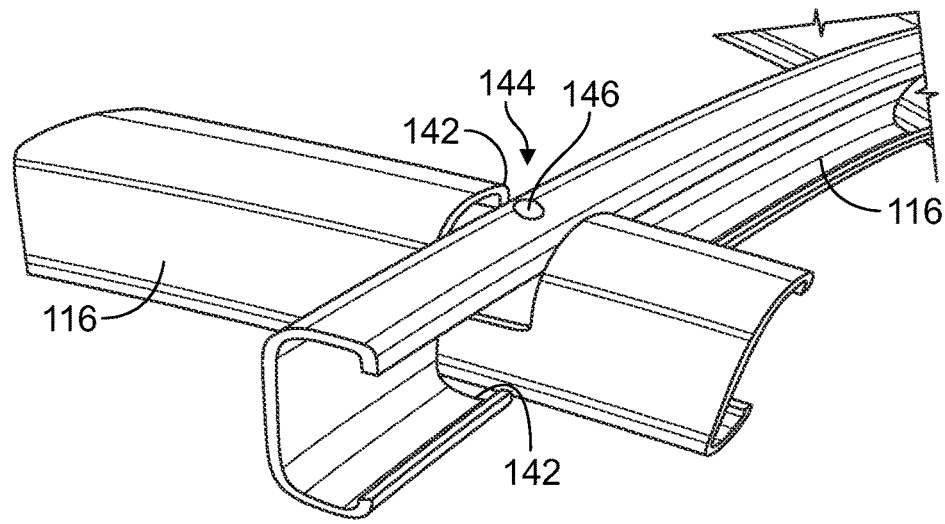
FIG. 5 is a diagrammatic representation of a connection joint between two frame segments of a geodesic module, according to an embodiment of the present disclosure.

FIG. 5 is a diagrammatic representation of a connection joint 144 between two frame segments 116 of a geodesic module 114, according to an embodiment of the present disclosure. As shown, the connection joint 144 may be securely fixed in position through a fastener 146, such as a rivet.

It is to be understood that the frame segments 116 may be sized and shaped differently than shown in FIGS. 4 and 5. For example, each frame segment 116 may be or otherwise include a planar strap of material. In at least one other embodiment, each frame segment 116 may be or otherwise include a cylindrical rod. In at least one other embodiment, each frame segment 116 may be or otherwise include an I-beam. As another example, each frame segment 116 may be shaped having an ovoid or elliptical cross-section. As another example, each frame segment 116 may have a square or rectangular cross section. In at least one other embodiment, each frame segment 116 may have an S-shaped or hat-shaped cross section.

Additionally, the connection joints 144 may be other than as shown in FIGS. 4 and 5. For example, the connection joints 144 may be formed through various joints, such as lap joints, interlocking or meshing joints, sawtooth connection interfaces, snap connections, latching connections, and/or the like. Further, various other fasteners other than shown may be used to secure the frame segments together. For example, the connection joints may be welded together, chemically-bonded together, sewn together using metallic wire or string, secured through nuts and bolts, and/or the like.

Figure 6:
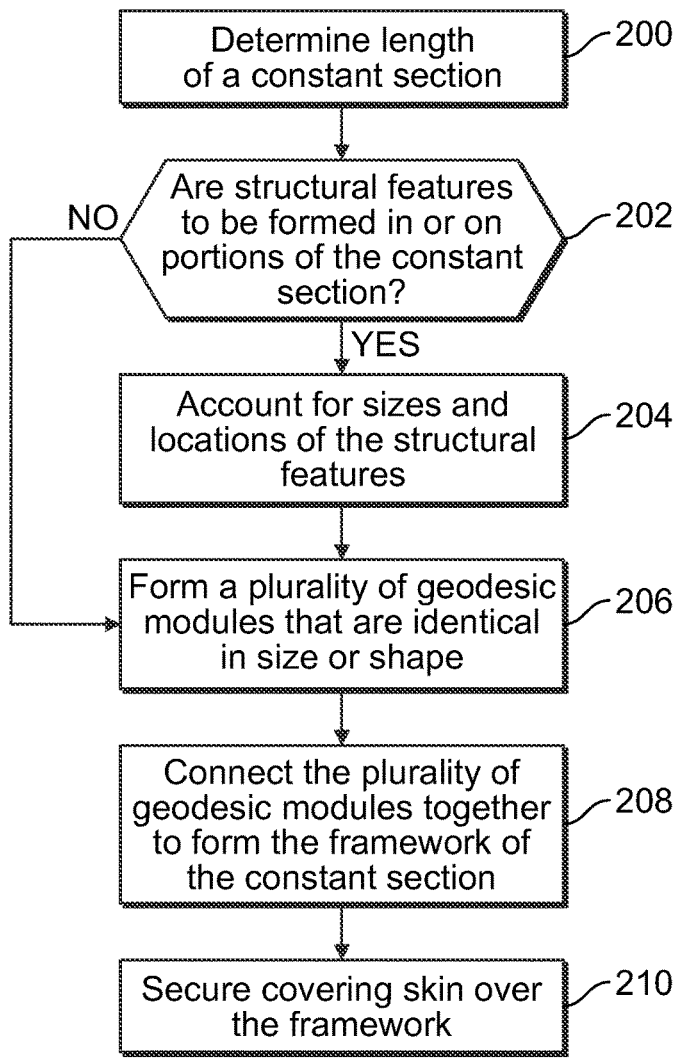
FIG. 6 illustrates a flow chart of a method of forming a portion of a fuselage of an aircraft, according to an embodiment of the present disclosure.

FIG. 6 illustrates a flow chart of a method of forming a portion of a fuselage of an aircraft, according to an embodiment of the present disclosure. The method shown in FIG. 6 may be used to determine a guide-curve geometry for a portion of a fuselage. The method begins at 200, in which a desired length of a constant section is determined. Then, at 202, it is determined if structural features are to be formed in or on portions of the constant section. For example, the structural features may be or include window openings, floor joints, doors, and/or the like. If such structural features are to be formed in the constant section, the method proceeds from 202 to 204, in which an accounting is performed of the sizes and locations of the structural features. For example, the sizes and locations of the structural features are used to determine a size of each geodesic module, so that at least one may accommodate a particular structural feature. The method then proceeds from 204 to 206, in which a plurality of geodesic modules that are identical in size and shape are formed. Returning to 202, if structural features are not to be formed in the constant section (for example, an underground pipe used to convey liquid, a conduit, tunnel, column, post, or the like), the method proceeds from 202 directly to 206.

After the plurality of geodesic modules are formed at 206, the plurality of geodesic modules are connected together at 208 to form a framework of the constant section. After the framework is formed, a covering skin may be secured over the framework at 210. Alternatively, 210 may be omitted, such as if a desired constant section is to be an open frame structure, such as a stanchion of a light tower.

Figure 7:
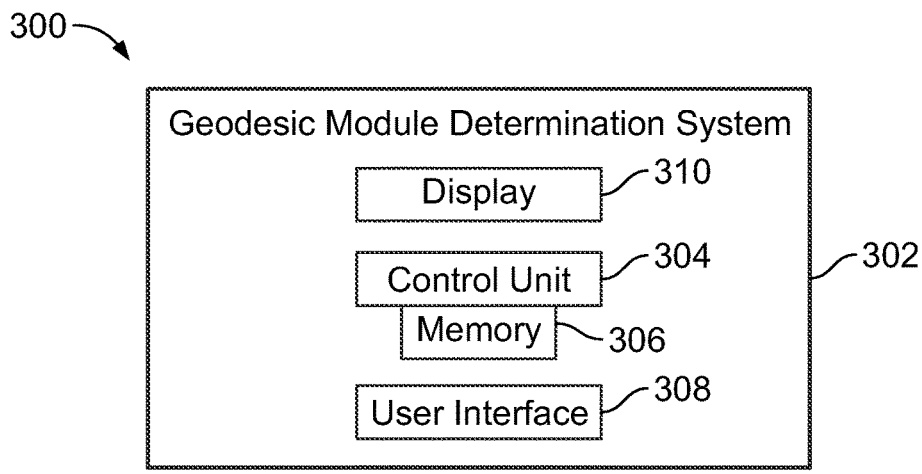
FIG. 7 illustrates a schematic diagram of a geodesic module determination system, according to an embodiment of the present disclosure.

FIG. 7 illustrates a schematic diagram of a geodesic module determination system 300, according to an embodiment of the present disclosure. The geodesic module determination system 300 may be used to account for sizes and locations of structural features, and determine a size and shape of geodesic modules. For example, the geodesic module determination system 300 may be used to analyze one or more parameters of a desired constant section and determine a size and shape of each geodesic module based on the analyzed parameters, as described below.

The geodesic module determination system 300 may include a housing 302 that contains a control unit 304 that may be in communication with a memory 306. Optionally, the memory 306 may be part of the control unit 304. The control unit 304 is also operatively coupled to a user interface 308, such as a keyboard, mouse, touchscreen, or the like, which allows an individual to input data into the geodesic module determination system 300. The control unit 304 may also be operatively coupled to a display 310, such as a computer monitor, television (such as a plasma, LED, LCD, or other such display), digital display, and/or the like. The control unit 304 may be operatively coupled to the components of the geodesic module determination system 300 through one or more wired or wireless connections, for example. In at least one embodiment, the geodesic module determination system 300 may be contained in a single device, such as a desktop or laptop computer, a handheld smart device (such as a smart phone), and/or the like. In at least one other embodiment, the various components of the geodesic module determination system 300 may be remotely located from one another.

The control unit 304 is used to analyze data and determine a size and shape of each geodesic module, all of which are identical. For example, the control unit 304 may be used to determine a size and shape of each geodesic module using the steps described as shown in the flow chart of FIG. 6. The control unit 304 may be used to determine the size and shape of each geodesic module as described below. For example, the control unit 304 may be used to determine a common size and shape of each geodesic module. That is, the control unit 304 may be used to determine a self-similar size and shape of each geodesic module that is used to form a framework of a constant section, such as that of a fuselage of an aircraft.

As used herein, the term "control unit," "unit," "central processing unit," "CPU," "computer," or the like may include any processor-based or microprocessor-based system including systems using microcontrollers, reduced instruction set computers (RISC), application specific integrated circuits (ASICs), logic circuits, and any other circuit or processor including hardware, software, or a combination thereof capable of executing the functions described herein. Such are exemplary only, and are thus not intended to limit in any way the definition and/or meaning of such terms. For example, the control unit 304 may be or include one or more processors that are configured to determine a size and shape of each geodesic module.

The control unit 304, for example, is configured to execute a set of instructions that are stored in one or more storage elements (such as one or more memories), in order to process data. For example, the control unit 304 may include or be coupled to one or more memories. The storage elements may also store data or other information as desired or needed. The storage elements may be in the form of an information source or a physical memory element within a processing machine.

The set of instructions may include various commands that instruct the control unit 304 as a processing machine to perform specific operations such as the methods and processes of the various embodiments of the subject matter described herein. The set of instructions may be in the form of a software program. The software may be in various forms such as system software or application software. Further, the software may be in the form of a collection of separate programs, a program subset within a larger program or a portion of a program. The software may also include modular programming in the form of object-oriented programming. The processing of input data by the processing machine may be in response to user commands, or in response to results of previous processing, or in response to a request made by another processing machine.

The diagrams of embodiments herein may illustrate one or more control or processing units, such as the control unit 304 shown in FIG. 7. It is to be understood that the processing or control units may represent circuits, circuitry, or portions thereof that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hardwired to perform the functions described herein. Optionally, the hardware may include electronic circuits that include and/or are connected to one or more logic-based devices, such as microprocessors, processors, controllers, or the like. Optionally, the control unit 304 may represent processing circuitry such as one or more of a field programmable gate array (FPGA), application specific integrated circuit (ASIC), microprocessor(s), a quantum computing device, and/or the like. The circuits in various embodiments may be configured to execute one or more algorithms to perform functions described herein. The one or more algorithms may include aspects of embodiments disclosed herein, whether or not expressly identified in a flowchart or a method.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

The control unit 304 may be used to determine and generate self-similar geodesic curves and determine and generate self-similar geodesic modules, such as the geodesic modules 114 shown in FIGS. 1, 3, and 4. A geodesic curve is the shortest possible curve connecting two points located on a given curved or arcuate surface. Assuming a smooth curvature distribution on a particular surface, a geodesic curve is generally defined by a curve γ(t) resting on that surface that minimizes the magnitude of a distance connecting points A and B located on a surface of interest, as defined by the following:

$$\text{length}(\gamma(t)) = \int_0^T |\gamma'(t)| dt \quad \text{Equation (1)}$$

The parameterization of the curve γ(t) and the integral in Equation (1) varies depending on the choice of the coordinate system. Because embodiments of the present disclosure relate to elongated bodies (such as constant sections of a fuselage of an aerospace or aeronautical vehicle), the control unit 304 may use a parameterization in the cylindrical coordinate system for defining γ(t) and its properties. Accordingly, Equation (1) can be re-written in the cylindrical coordinate system as:

$$\text{length}(\gamma(t)) = \int_0^T \sqrt{\left(\frac{dr}{dt}\right)^2 + r^2\left(\frac{d\theta}{dt}\right)^2 + \left(\frac{dz}{dt}\right)^2} \, dt \quad \text{Equation (2)}$$

in which r is the radial component of the coordinate system, θ is the angular component of the coordinate system, and z is the longitudinal component of the coordinate system.

It can be shown that a curve described in the cylindrical coordinate system by Equation (3) generates the shortest distance between any two points located on such surface:

$$\gamma(t) = \begin{cases} r(t) \\ \theta(t) = t \\ z(t) = t \end{cases} \quad \text{Equation (3)}$$

$$t \in [0, T]$$

in which r(t) is the longitudinal profile of the body (that is, a non-constant longitudinal cross-section), and t is the independent parameter varying from 0 to T. The control unit 304 may utilize geometric definitions in Cartesian (i.e., x-y-z) coordinate systems. Therefore, in a Cartesian coordinate system Equation (3) can be re-written as:

$$\gamma(t) = \begin{cases} x(t) = a(t)\cos(t) \\ y(t) = a(t)\sin(t) \\ z(t) = b(t) \end{cases} \quad \text{Equation (4)}$$

$$t \in [0, T]$$

in which a and b are control parameters. Equation (4) yields a right-handed geodesic curve (a "right handed curve"). An equally valid solution is generated if all components of γ(t) in Equation (4) are negated to the opposite to obtain a left-handed geodesic curve (a "left handed curve"):

$$\gamma(t) = \begin{cases} x(t) = -a(t)\cos(t) \\ y(t) = -a(t)\sin(t) \\ z(t) = -b(t)t \end{cases} \quad \text{Equation (5)}$$

$$t \in [0, T]$$

Using differential geometry, it can be shown that the curvature of γ(t) can be expressed as:

$$\kappa(t) = \frac{|a(t)|}{a(t)^2 + b(t)^2} \quad \text{Equation (6)}$$

Similarly, the torsion of such curve can be expressed as:

$$\tau(t) = \frac{b(t)}{a(t)^2 + b(t)^2} \quad \text{Equation (7)}$$

The control unit 304 may be configured to impose self-similarity on all of the geodesic modules 114 that are used to form a particular framework of a constant section 100. For example, the control unit 304 may generate a γ(t) curve such that for any discrete range of a<t<b, the segments of such curve are identical. Moreover, the control unit 304 may determine a constant torsion τ throughout the geometry, which allows the determined curves to be generally suitable as guide curves in designing structural elements.

To achieve self-similarity for a geodesic curve between points A and B (such as the opposite ends 104 and 106 shown in FIG. 1), independent of the range of t, the curvature κ is to remain constant throughout. This implies that the control parameters a(t) and b(t) in Equation (6) are independent of t, yielding:

$$\kappa(t) = \kappa = \frac{|a|}{a^2 + b^2} \quad \text{Equation (8)}$$

Consequently, this implies that parameters a and b do not depend on variable t in Equations 4 and 5, and therefore are constant throughout the geometry, yielding Equation (9):

$$\gamma(t) = \begin{cases} x(t) = \pm a \cos(t) \\ y(t) = \pm a \sin(t) \\ z(t) = \pm b \end{cases} \quad \text{Equation (9)}$$

$$t \in [0, T]$$

If parameters a and b are independent of variable t, it can be observed that the torsion τ of the curve γ(t) is also a constant value throughout the geometry, and yielding:

$$\tau(t) = \tau = \frac{b}{a^2 + b^2} \quad \text{Equation (10)}$$

From the definition of x(t) and y(t) in Equation (9), it is possible to observe that the trace of γ(t) on the x-y plane in the Cartesian coordinate system constitutes a circle of radius a. Therefore, the control unit 304 enforces a cylindrical base surface, and the curve γ(t) describes the shortest distance path between any two points, such that all of the geodesic modules 114 are self-similar (that is, identical and interchangeable) if applied to any discrete range of t.

The control unit 304 may be used to accommodate a variety of features to be formed within a constant section. For example, the control unit 304 may be used to accommodate a variety of fuselage features of an aircraft. For example, the control unit 304 may apply equation (9), and generate guide curves that may be used to generate self-similar structural elements, such as the identical geodesic modules 114. In addition to parameters a and b noted above, a set of configuration parameters may be introduced to allow the accommodation of various external and internal features of a fuselage structure in applications such as fuselages for aircraft or a space launch vehicle. Examples of such internal features include the following: (1) Cut-outs: openings in the fuselage that cannot be obstructed by a structural element; The cut-outs may include windows, doors, emergency exits, and access hatches; (2) Tie-ins to other primary structures: to accommodate the tie-ins, the self-similar geodesic paths (that is, the geodesic paths that are used to form the shape and size of each geodesic module) intersect each other at places that allow hard-points to be installed and major loads to be carried therethrough (for example, the tie-ins may relate to main and cargo floor beam ends, as well as floor beam supporting stanchions); (3) Tie-ins to install subsystems, such as hard-points for the installation of stow bins or main air-conditioning ducts in the crown of the fuselage.

It is to be understood that the configuration parameters do not disturb the self-similarity of the curves defined by Equation 9. Instead, the configuration parameters merely define the relationship of multiple self-similar geodesic curves with respect to each other. Any discrete segment (such as a geodesic module) of the resulting geometry is also self-similar.

Figure 8:
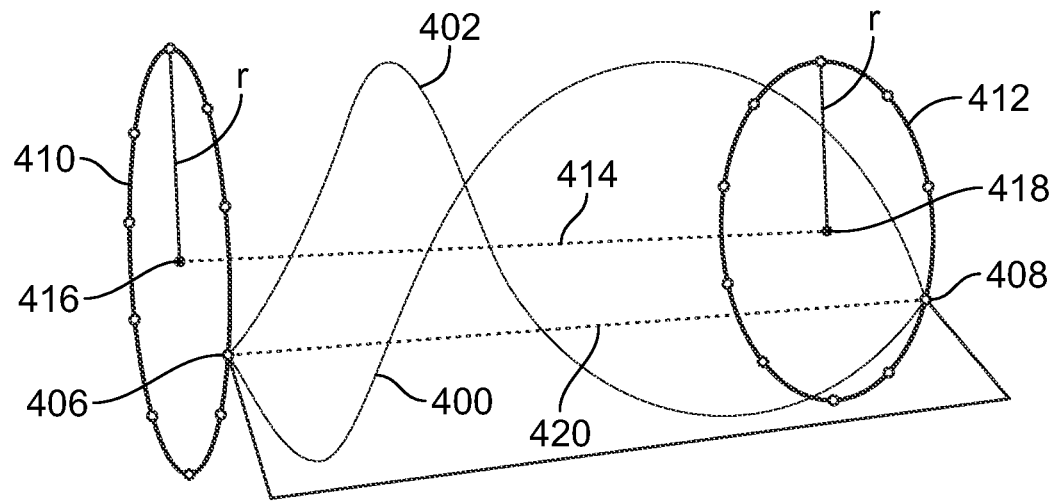
FIG. 8 is a diagrammatic representation of a right-handed curve and a left-handed curve extending between corresponding points of end circles, according to an embodiment of the present disclosure.

FIG. 8 is a diagrammatic representation of a right-handed curve 400 and a left-handed curve 402 extending between corresponding seed nodes 406 and 408 of end circles 410 and 412, according to an embodiment of the present disclosure. In order to determine a size and shape of each geodesic module 114 (shown in FIGS. 1, 3, and 4), the control unit 304 (shown in FIG. 7) first determines a desired length of a constant section. For example, an individual may input a desired length of the constant section into the geodesic module determination system (shown in FIG. 7) through the user interface 308. The desired length 414 is a straight line distance from a center 416 of the end circle 410 to a center 418 of the end circle 412.

Based on user input, the control unit 304 may determine a size of each end circle 410 and 412. For example, the control unit 304 may determine a distance of radius r for each end circle 410 and 412. The radius r may be the same over the length 414. That is, constant section may be formed as a cylinder having a uniform radius r and constant curvature over the length 414.

The control unit 304 then determines the number of seed nodes for each of the end circles 410 and 412. Seed nodes are the fixed points used to connect corresponding end points of a self-similar geodesic curve, and their location influences the interaction of the guide curves with other features of the constant section, for example. The seed nodes, such as the corresponding seed nodes 406 and 408, are the points between which the control unit 304 generates right and left handed curves, such as the right and left handed curves 400 and 402. For example, the seed nodes 406 and 408 are corresponding seed nodes, meaning that they are positioned along a straight line 420 that is parallel with the length (or central longitudinal axis) 414 between the centers 416 and 418. For each set of corresponding seed nodes, a corresponding right handed curve and a left handed curved are drawn. For example, the right and left handed curves 400 and 402 extend between the corresponding seed nodes 406 and 408. The control unit 304 may generate the right and left handed curves between corresponding seed nodes through Equations (4) and (5), for example.

The control unit 304 determines the number of seed nodes based, at least in part, on the features within a constant section that are to be accounted for (such as window openings), and on a desired structural integrity of the constant section. As such, the number of seed nodes may be a function of the features to be formed in and/or on the constant section and the structural integrity (for example, rigidity, strength, resilience, and the like) of the constant section. For example, if too many seed nodes are used, the resulting geodesic areas between frame segments of geodesic modules may be too small to accommodate features such as windows. Conversely, if too few seed nodes are used, the resulting constant section may not be able to withstand various loads exerted thereon during operation (such as torsional loads exerted on a fuselage in flight).

As shown, the right and left handed curves 400 and 402 are mirror images of one another. The control unit 304 generates right and left handed curves for each set of corresponding seed nodes. As shown in FIG. 8, there are ten sets of corresponding seed nodes. That is, each end circle 410 and 412 includes ten regularly and equally spaced seed nodes. Therefore, a total of twenty curves extend between the end circles 410 and 412, ten of which are right handed curves, and ten of which are left handed curves. More or less seed nodes and curves may be generated, depending on particular desired parameters (for example, length, radius, accommodated features, and the like). The shape of the curves and the intersections therebetween define the size and shape of each geodesic module. For example, the intersections define the connection joints between the frame segments of the geodesic modules. Thus, the control unit 304 may determine the size and shape for each geodesic module by forming the geodesic right and left handed curves between corresponding seed nodes, and locating the intersections therebetween.

The pitch relates to the straight line distance 420 between a set of corresponding seed nodes, such as the corresponding seed nodes 406 and 408. The pitch may be the distance along the center line length 414 required for the value of x and y components of Equation (9) to coincide with the x and y of the seed nodes. The pitch may be equivalent to $2\pi b$.

The pitch angle may be calculated by multiplying the number of seed nodes by a window frame pitch. For example, if ten seed nodes for each end circle 410 and 412 are used, and the target window pitch is 30 inches, the control unit 304 may set the pitch of the geodesic curve to 300 inches, which corresponds a value of b=47.74, and generates a set of right-handed and left-handed curves that will not intersect windows spaced at 30 inch intervals.

Figure 9:
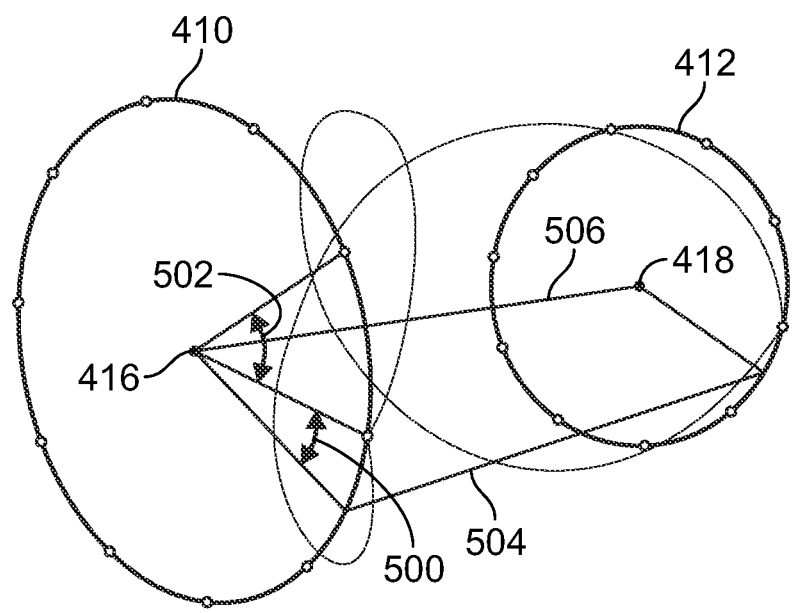
FIG. 9 is a diagrammatic representation of angular relationships between seed nodes of an end circle, according to an embodiment of the present disclosure.

FIG. 9 is a diagrammatic representation of angular relationships between seed nodes of an end circle, according to an embodiment of the present disclosure. The control unit 304 determines a location of a seed node using two angles: the offset angle 500 and the spread angle 502. The offset angle 500 provides the radial angle made with a waterline zero plane 504 that is a horizontal plane that passes through the central longitudinal axis 506 that extends between the centers 416 and 418 of the end circles 410 and 412 of the constant section. The spread angle 502 is the constant angle between neighboring (that is, closest) seed nodes located in the same end circle 410 or 412. The control unit 304 may compute the spread angle by the following formula:

$$2\pi/n \qquad \text{Equation (11)}$$

where n is the number of seed nodes.

In order to determine the value for each of the angular values (such as the offset angle 500 and the spread angle 502), the control unit 304 may employ a geometric design of experiments involving various input parameters related to the overall configuration of a particular constant section. Examples of such input parameters for a commercial aircraft include, but are not limited to, the following: fuselage outer diameter and overall length of the section; location and dimensions of passenger doors, emergency exits and cargo doors; location and dimensions of accesses hatches for critical systems; desired height of the main cabin above floor level; desired height of the cargo hold above the cargo hold floor level; relative height of the windows with respect to the floor level; desired geometry of the main floor beam stanchions; and the like. After such parameters are input, the control unit 304 may define a measure of merit function to allow prioritization of the relative significance of the parameters on the structural design of the geodesic constant section. Then, the control unit 304 may construct a parametric model of the full geometry and determine a design of experiment (DOE) process to define the geodesic curves and resulting geodesic modules.

Figure 10:
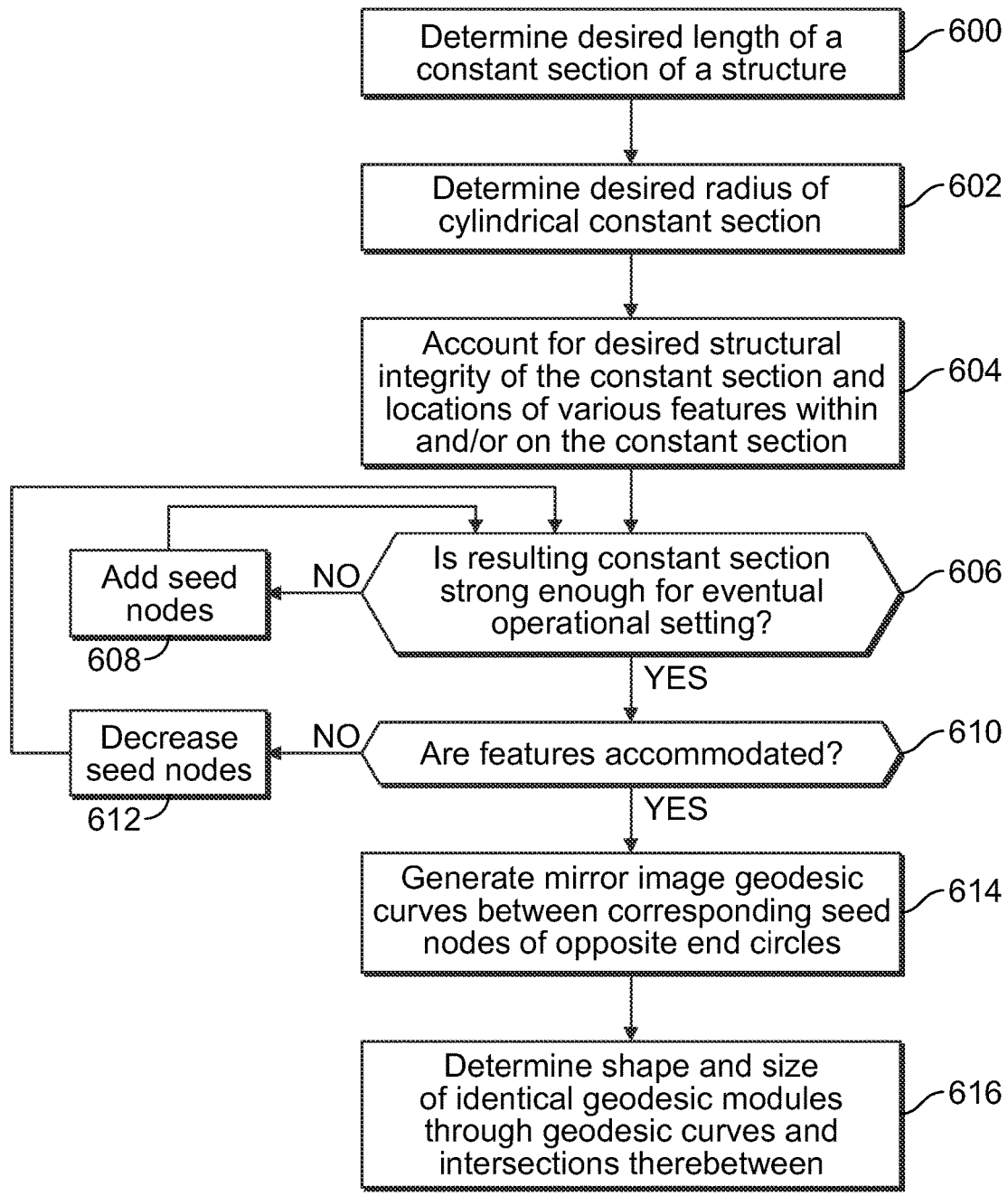
FIG. 10 illustrates a flow chart of a method of determining a size and shape of each geodesic module of a constant section, according to an embodiment of the present disclosure.

FIG. 10 illustrates a flow chart of a method of determining a size and shape of each geodesic module of a constant section, according to an embodiment of the present disclosure. The control unit 304 may be configured and programmed to operate according to the flow chart shown and described with respect to FIG. 10.

The method begins at 600, in which a desired length of a constant section of a structure is determined. For example, a user may input the desired length into a geodesic module determination system through a user interface (such as the interface 308 shown in FIG. 7). At 602, a desired radius of the cylindrical constant section 602 is determined, which, again, may be based on user input. The desired radius is used to form the size of mirror image end circles.

At 604, the control unit 304 accounts for a desired structural integrity of the constant section and locations of various features (such as windows) that are to be formed on and/or within the constant section. At 606, it is determined if the resulting constant section is strong enough for an eventual operational setting (such as high speed flight up to a particular altitude). If not, the control adds seed nodes at 608, and the method returns to 606. If the resulting constant section is strong enough at 606, the method proceeds from 606 to 610, in which the control unit 304 determines whether one or more features (such as windows, doors, and the like) are accommodated. For example, the control unit 304 determines whether an eventual geodesic module is able to accommodate a corresponding feature to be formed between and/or through frame segments. If not, the seed nodes are decreased at 612. By decreasing the number of seed nodes, the resulting geodesic modules define larger geodesic areas. However, a decreased number of seed nodes may reduce the structural integrity of the constant section. Accordingly, the method proceeds from 612 back to 606, as described above.

If, however, the features are accommodated at 610 (and the integrity of the resulting constant section is confirmed at 606), the method proceeds from 610 to 614, in which mirror image geodesic curves are generated and drawn between corresponding seed nodes of the opposed end circles. Then, at 616, the shape and size of identical geodesic modules are determined through the geodesic curves and intersections therebetween, such as shown in FIG. 1.

After the size and shape of each identical geodesic module is determined, the geodesic modules may be formed as described above. Then, the geodesic modules may be assembled together to form the structural framework of the constant section.

Figure 11:
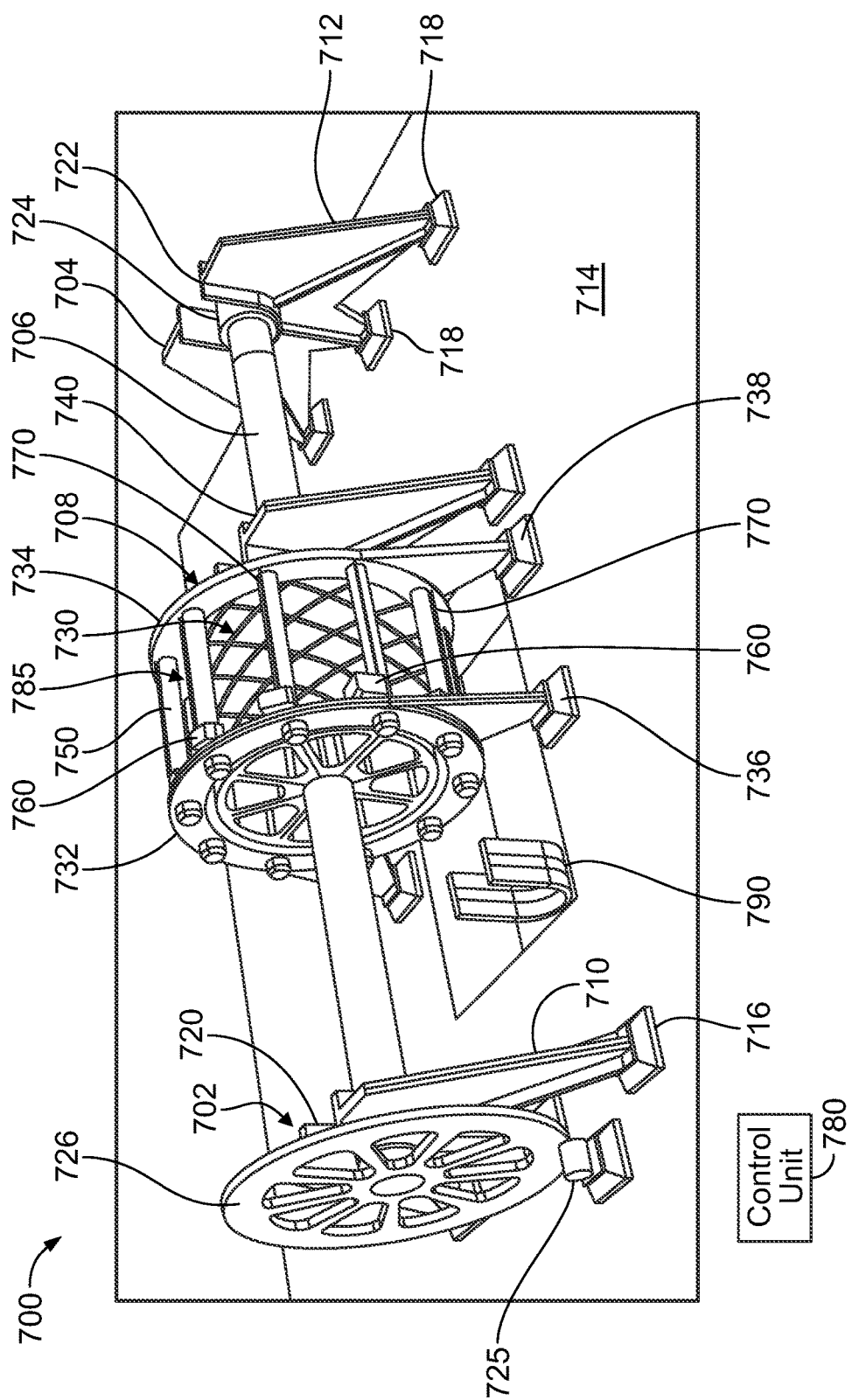
FIG. 11 is a diagrammatic representation of a perspective top view of a constant section forming system, according to an embodiment of the present disclosure.
Figure 12:
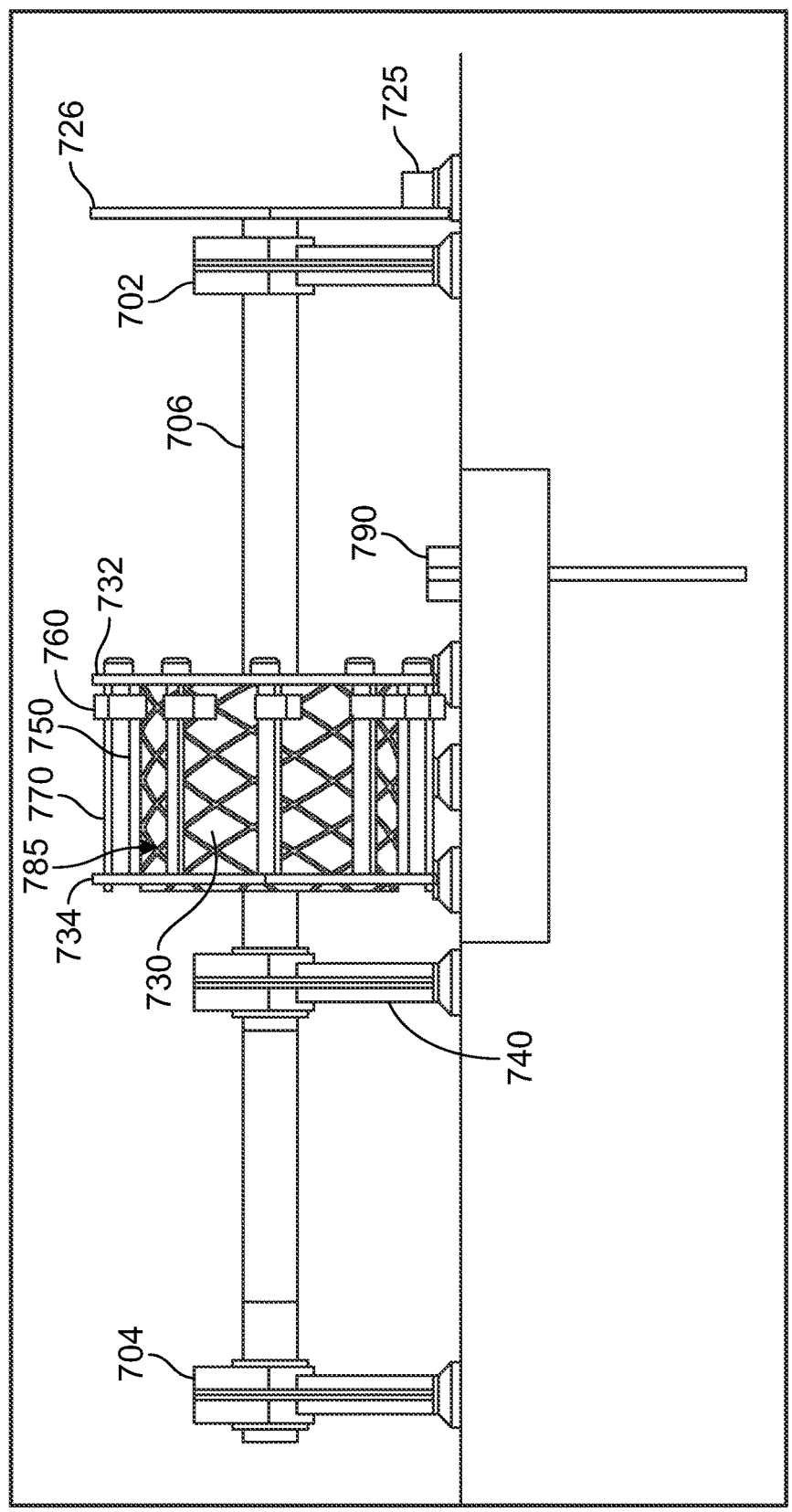
FIG. 12 is a diagrammatic representation of a rear view of a constant section forming system, according to an embodiment of the present disclosure.

FIG. 11 is a diagrammatic representation of a perspective top view of a constant section forming system 700, according to an embodiment of the present disclosure. FIG. 12 is a diagrammatic representation of a rear view of the constant section forming system 700. Referring to FIGS. 11 and 12, after the size and shape of the geodesic modules is determined, as described above, the geodesic modules are assembled, such as through one or more of the following: assembling and fastening portions together, sheet metal forming, forging, hydro forming, roller forming, casting, tape laying and resin infusion, additive manufacturing, molding, and the like. After the geodesic modules are assembled, the constant section forming system 700 may be used to assemble the geodesic modules together to form a framework that is secured to a covering skin.

The forming system 700 may include end brackets 702 and 704 that rotatably support a central axle 706 that extends through an operative assembly 708. Each bracket 702 and 704 may include a main body 710 and 712 securely supported on a floor 714 by a plurality of feet 716 and 718. Channels 720 and 722 are formed through upper portions of the main bodies 710 and 712 and retain bearings 724 that rotatably retain ends of the central axle 706. An actuator 725 may be operatively coupled to a link 726 that is connected to the axle 706 and is configured to rotate the axle 706. For example, the actuator 725 may be a servo motor operatively coupled to the axle 706 through the link 726. Alternatively, the actuator 725 may be or include an electric engine, a combustion engine, hydraulic motor, pneumatic motor, an electro-mechanical engine, and/or the like. The link 725 may be a geared wheel, disc, or the like that operatively connects the actuator 725 to the axle 706. In at least one other embodiment, the actuator 725 may be directly connected to the axle 706 without an intermediate linking mechanism.

The operative assembly 708 includes a central mandrel 730 that is operatively coupled to the axle 706. Rotation of the axle 706 causes a corresponding rotation of the mandrel 730. The operative assembly 708 also includes opposed support brackets 732 and 734 positioned proximate to opposite ends of the mandrel 730. The support brackets 732 and 734 are securely fixed in position by feet 736 and 738 mounted to the floor 714. An additional support bracket 740 may be used to support the axle 706 between the operative assembly 708 and the bracket 704, for example.

Rails 750 are secured between the support brackets 732 and 734. The rails are generally parallel to a central longitudinal axis of the axle 706. More or less rails 750 than shown may be used. Operating heads 760 may be moveably secured to the rails 750 around the mandrel 730. The operating heads 760 may be configured to drill and/or rivet, for example. The operating heads 760 may be configured to slide over the rails 750.

The number of rails 750 and the number of supported operating heads 760 may be equal to the number of seed nodes of each end circle, such as shown and described with respect to FIG. 8. The operating heads 760 are moveably mounted on the rails 750 and are configured to longitudinally traverse thereon. For example, each operating head 760 may be operatively coupled to a jackscrew 770 that is configured to move each operating head 760 on a respective rail 750. Optionally, the operating heads 760 may be moveably secured on the rails 750 through independent rollers, motors, or the like.

A forming chamber 785 is defined between the support brackets 732 and 734 and the rails 750. In the forming position, the mandrel 730 is positioned within the forming chamber 785.

In operation, each geodesic module (such as shown in FIG. 4) is secured to the mandrel 730. For example, the geodesic modules may be held in place through pneumatic suction. The actuator 725 then operates to rotate the mandrel 730 by way of the axle 706. The actuator 725 may rotate the mandrel at predetermined angles. A control unit 780 may be operatively connected to the actuator 725 to control rotation of the mandrel 730.

The control unit 780 may stop rotation of the mandrel at prescribed intervals so that the operating heads 760 may operate on the geodesic modules, such as through drilling, riveting, and/or the like. For example, the operating heads 760 may drill holes through frame segments of the geodesic modules and then drive rivets therethrough to securely connect frame segments together to form and geodesic modules and secure neighboring geodesic modules together. The control unit 780 may operate the system 700 to fasten skin panels to the assembled geodesic modules in a similar manner. The control unit 780 may determine locations of the holes and rivets through a combination of longitudinal location of the operating heads 760 on the rails 750, as well as the angle of the rotation angle of the mandrel 730 in relation to the operating heads 760. As such, the operating heads 760 are able to operate on any given coordinate of components secured to the mandrel 730.

This system 100 provides an efficient and cost-effective system and method of forming a constant section. As noted, the control unit 780 may be configured to control operation of the system 700. The control unit 780 may be in communication with the actuator 725 and the operating heads 760 to control their operations. For example, the control unit 780 may be in communication with the actuator 725 and/or the operating heads 760 through wired or wireless connections.

As noted, the system 700 may be used to secure frame segments together to form geodesic modules. In at least one other embodiment, the geodesic modules may be separately secured to the mandrel, and the system 100 may be used to secure an outer skin to the structural framework defined by the interconnected geodesic modules. For example, the mandrel 730 may be rotated to various positions, and the operating heads 760 may drill through the outer skin and secure the outer skin to the structural framework through rivets, for example. In at least one embodiment, the system 700 may be used to concurrently secure frame segments together and secure the outer skin to the structural framework.

After the outer skin has been secured to the structural framework around the mandrel 730, the mandrel 730 may be removed from the forming chamber 785. For example, the mandrel 730 may be unlocked from the axle 706 and slid out of the forming chamber 785 on the axle toward the actuator 725. As such, the mandrel 730 is removed from a position between the support brackets 732 and 734. A support cradle 790 may then be upwardly moved toward and cradle the axle 706 in a support position. The formed constant section may then be removed from the mandrel.

The mandrel 730 may generally be stopped before structure secured thereto is operated upon by the operating heads 760. That is, the motion of the mandrel 730 may not be continuous during a forming operation. A braking mechanism may be used to periodically stop motion of the mandrel 730. In at least one embodiment, the actuator 725 may be configured to provide residual resisting torque that may stop motion of the mandrel 730 in response to the actuator 725 stopping. In at least one other embodiment, the mandrel 730 may stop rotating by a change in polarity and current supplied to the actuator 725 such that a counter-torque is generated (for example, running the actuator 725 in reverse until the mandrel 730 stops rotating). In at least one other embodiment, a separate and distinct brake may be used to stop rotation of the mandrel 730.

The control unit 780 may include any processor-based or microprocessor-based system including systems using microcontrollers, reduced instruction set computers (RISC), application specific integrated circuits (ASICs), logic circuits, and any other circuit or processor including hardware, software, or a combination thereof capable of executing the functions described herein. Such are exemplary only, and are thus not intended to limit in any way the definition and/or meaning of such terms. For example, the control unit 780 may be or include one or more processors that are configured to determine a size and shape of each geodesic module.

The control unit 780, for example, is configured to execute a set of instructions that are stored in one or more storage elements (such as one or more memories), in order to process data. For example, the control unit 780 may include or be coupled to one or more memories. The storage elements may also store data or other information as desired or needed. The storage elements may be in the form of an information source or a physical memory element within a processing machine.

The set of instructions may include various commands that instruct the control unit 780 as a processing machine to perform specific operations such as the methods and processes of assembling a constant section. The set of instructions may be in the form of a software program. The software may be in various forms such as system software or application software. Further, the software may be in the form of a collection of separate programs, a program subset within a larger program or a portion of a program. The software may also include modular programming in the form of object-oriented programming. The processing of input data by the processing machine may be in response to user commands, or in response to results of previous processing, or in response to a request made by another processing machine.

The diagrams of embodiments herein may illustrate one or more control or processing units, such as the control unit 780 shown in FIG. 11. It is to be understood that the processing or control units may represent circuits, circuitry, or portions thereof that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hardwired to perform the functions described herein. Optionally, the hardware may include electronic circuits that include and/or are connected to one or more logic-based devices, such as microprocessors, processors, controllers, or the like. Optionally, the control unit 304 may represent processing circuitry such as one or more of a field programmable gate array (FPGA), application specific integrated circuit (ASIC), microprocessor(s), a quantum computing device, and/or the like. The circuits in various embodiments may be configured to execute one or more algorithms to perform functions described herein. The one or more algorithms may include aspects of embodiments disclosed herein, whether or not expressly identified in a flowchart or a method.

Figure 13:
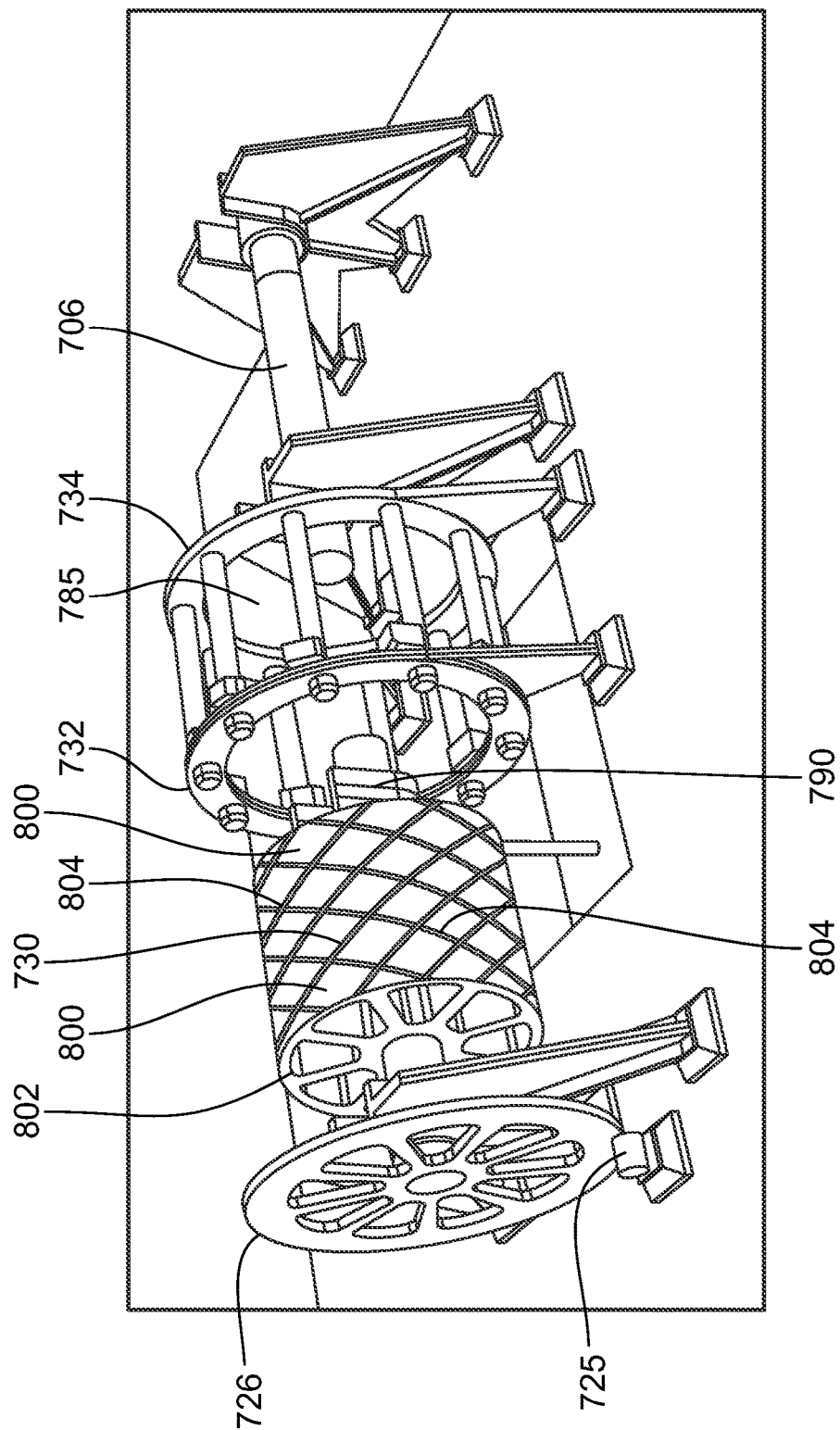
FIG. 13 is a diagrammatic representation of a perspective top view of a constant section forming system with a mandrel in a removed position, according to an embodiment of the present disclosure.

FIG. 13 is a diagrammatic representation of a perspective top view of a constant section forming system 700 with the mandrel 730 in a removed position, according to an embodiment of the present disclosure. The support cradle 790 is moved upwardly to support the axle 706 so that the mandrel 730 does not slide off the axle 706 toward the support bracket 732. The support cradle 790 also allows the actuator 725 to safely rotate the mandrel 730 in the removed position. For example, the mandrel 730 may be rotated in the removed position to inspect the mandrel 730.

As shown, the mandrel 730 may include a plurality of pads 800 that may conform to the shape of a geodesic area between frame segments. The pads 800 may be selectively actuated between deployed and retracted positions. In the deployed state, the pads 800 may upwardly extend from the mandrel 730. In the retracted position, the pads 800 may retract into a main body 802 of the mandrel 730. In the deployed position, a plurality of grooves 804 between the pads 800 are formed on the main body 802. The grooves 804 may be configured to retain portions of the constant section, such as frame segments of geodesic modules. In order to remove the constant section from the mandrel 730, the pads 800 are retracted, thereby eliminating, minimizing, or otherwise reducing the grooves 804, which therefore disengages the constant section from the mandrel 730. For example, the pads 800 may be retracted to eliminate the grooves 804 and form a smooth outer surface on the mandrel 730. The constant section may then be slid off of the mandrel 730, for example.

Figure 14:
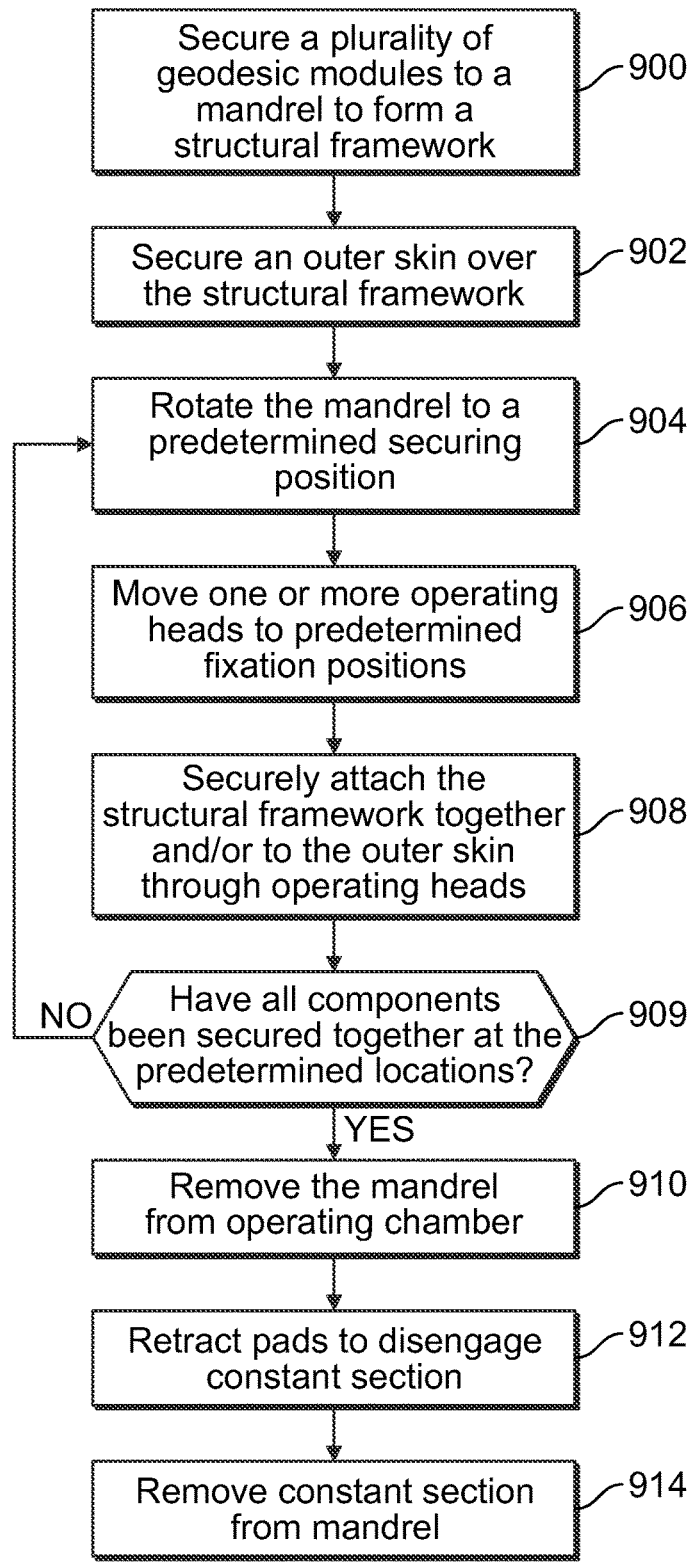
FIG. 14 illustrates a flow chart of a method of forming a constant section, according to an embodiment of the present disclosure.

FIG. 14 illustrates a flow chart of a method of forming a constant section, according to an embodiment of the present disclosure. The control unit 780 shown in FIG. 11 may be used to operate the forming system 700 shown in FIGS. 11-13 according to the method shown and described with respect to FIG. 14.

The method begins at 900, in which a plurality of geodesic modules are secured to a mandrel to form a structural framework. For example, frame segments of the geodesic modules may be securely retained within grooves formed between deployed pads of the mandrel. At 902, an outer skin (or skin portion) may be secured over the structural framework on the mandrel. Then, at 904, the mandrel may be rotated to a predetermined securing position. At 906, one or more operating heads are moved to one or more predetermined fixation points relative to the outer skin and/or the geodesic modules. Then, at 908, the structural framework is securely attached together and/or to the outer skin through the operating heads (such as by drilling and riveting). At 909, the control unit determines if all of the components of the constant section have been secured together at the predetermined locations. If not, the method proceeds from 909 back to 904. If, however, all of the components have been secured together, the method proceeds from 909 to 910, in which the mandrel is removed from an operating chamber. At 912, the pads of the mandrel are retracted, so that the framework and/or the outer skin are no longer retained within grooves of the mandrel (if suction is used to secure geodesic modules to the mandrel, the suction may be deactivated during 912). Then, at 914, the constant section may be removed from the smooth mandrel, such as by being slid off the mandrel.

FIG. 15 illustrates a diagrammatic representation of a lateral view of a constant section forming system 1000 moveably secured on a constant section 1002, according to an embodiment of the present disclosure. The constant section 1002 may include an outer skin secured on a structural framework, which may be formed through a plurality of geodesic modules, as described above. The forming system 1000 is used to secure the outer skin to the structural framework.

FIG. 16 illustrates a diagrammatic representation of a lateral view of the constant section forming system 1000, while FIG. 17 illustrates a diagrammatic representation of an end view of the constant section forming system 1000. Referring to FIGS. 15-17, the constant section forming system 1000 may include an annular mandrel 1001 that may be configured to fit over an outer surface of the constant section 1002, and/or at or proximate to a terminal end of the constant section 1002. A rotatable tool ring 1004 is rotatably secured to the mandrel 1001. The rotatable tool ring 1004 includes a plurality of operating heads 1006, such as those described above. A control unit (such as the control unit 780) may be in communication with the forming system 1000 to control operation.

The mandrel 1001 moves the forming system 1000 over the constant section 1002 in the direction of arrow 1010. That is, the mandrel 1001 may be configured to move the forming system 1000 over the constant section 1002 in a linear direction. In at least one other embodiment, the mandrel 1001 may remain at the end of the constant section 1002 and may be configured to move the tool ring 1004 over the constant section. The mandrel 1001 may not rotate in relation to the constant section 1002. In at least one embodiment, the forming system 1000 may include rails that extend over the constant section 1002. The mandrel may be moveably secured to the rails through rollers, wheels, one or more rack and pinion assemblies, and/or the like.

The tool ring 1004 is configured to rotate in relation to the mandrel 1001. The tool ring 1004 is rotated to various predetermined positions so that the operate heads 1006 securely fix the outer skin to the structural frame, such as through drilling and riveting.

As shown in FIG. 16, one or more translation motors 1020 (such as electric, piezoelectric, or the like motors) are operatively connected to pinions 1022, which may be operatively connected to racks 1024. The motors 1020 drive the pinions 1022 to move the forming system 1000 over the constant section 1002 in the direction of arrows 1010.

One or more rotational motors 1030 may be secured within or otherwise to the mandrel 1001 and operatively connected to an annular gear rack 1032 of the tool ring 1004 through a pinion 1034. The rotational motor(s) 1030 are configured to rotate the tool ring 1004 about the constant section 1002.

As described above, the mandrel 1001 may translate over the constant section 1002. In at least one other embodiment, the mandrel 1001 may be fixed in position and operatively connected to the tool ring 1004 through the racks 1024. The tool ring 1004 may translate toward and away from the mandrel 1001 by way of the motors 1020 rotating the pinions 1022 with respect to the racks 1024. The motors 1030 may be secured to the tool ring 1004 and configured to rotate the tool ring 1004 relative to the constant section 1002 as described above.

In at least one embodiment, electric power used by the operating heads 1006 may be transferred via contact power feeders integral to the support structure of the system 1000, as cables may limit an operational range. Alternatively, the operating heads 1006 may be connected to a power source through wired connections, such as cables.

After the forming system 1000 has secured the outer skin to the structural framework to form the constant section 1002, the forming system 1000 may be removed from the outer skin. For example, the mandrel 1001 and the tool ring 1004 may be slid off the constant section 1002.

Figure 18:
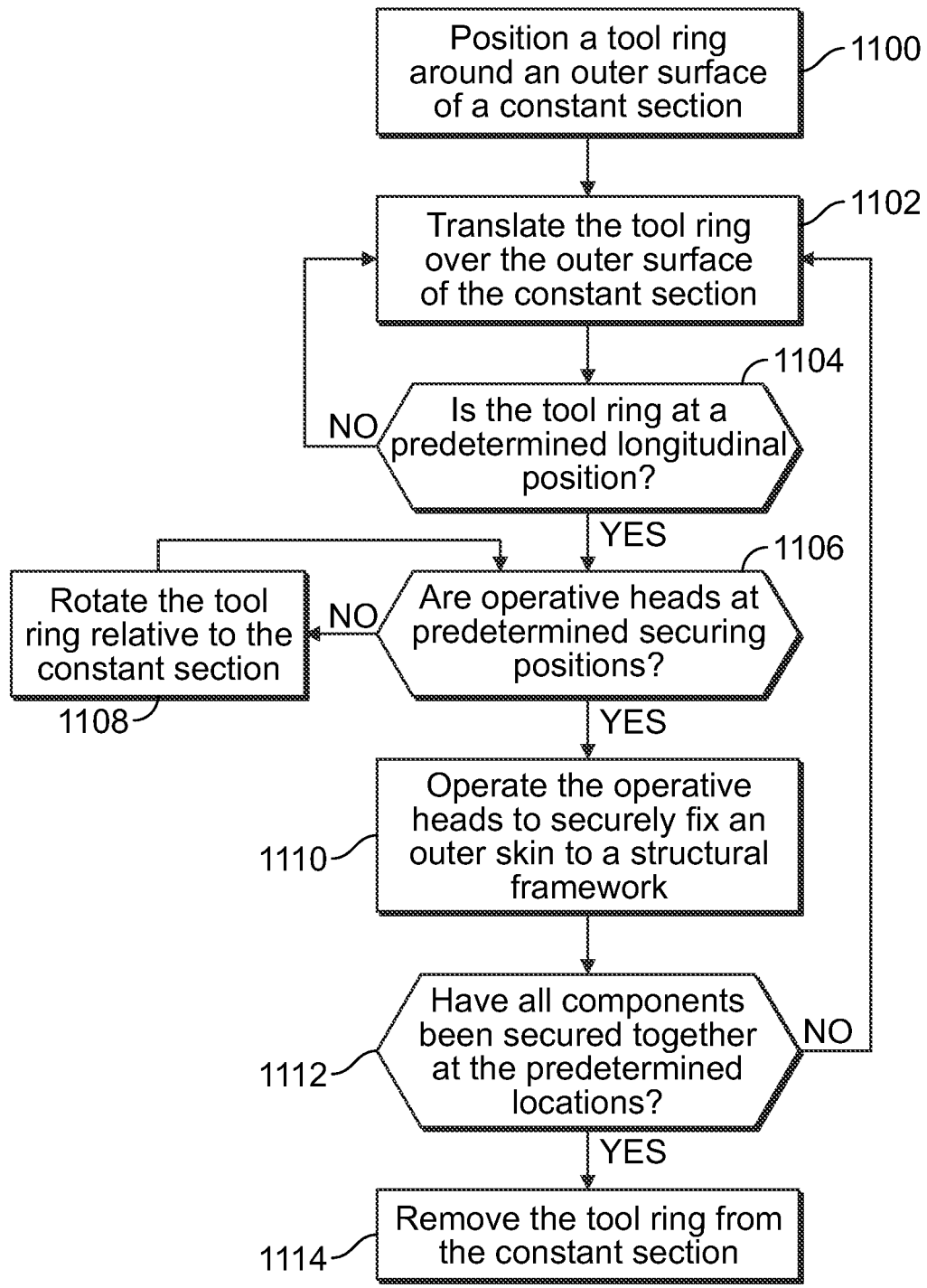
FIG. 18 illustrates a flow chart of a method of forming a constant section, according to an embodiment of the present disclosure.

FIG. 18 illustrates a flow chart of a method of forming a constant section, according to an embodiment of the present disclosure. The control unit 780 shown in FIG. 11 may be used to operate the forming system 1000 shown in FIGS. 15-17 according to the method shown and described with respect to FIG. 18.

The method begins at 1100, in which a tool ring is positioned around an outer surface of a constant section. At 1102, the tool ring is linearly translated over the outer surface of the constant section. In at least one embodiment, the tool ring linearly translates away from a fixed mandrel. In at least one other embodiment, both the tool ring and a translating mandrel translate over the outer surface of the constant section.

At 1104, it is determined if the tool ring is at a predetermined longitudinal position (for securing operations) in relation to the constant section. If not, the method returns to 1102. If so, however, the method proceeds from 1104 to 1006, in which it is determined if operating heads of the tool ring are at predetermined securing positions in relation to the constant section. If not, the method proceeds to 1008, in which the tool ring is rotated relative to the constant section. The method then returns to 1106. If the operating heads are at a predetermined securing position relative to the constant section, the operating heads are operated at 1110 to securely fix an outer skin to a structural framework.

The method then continues to 1112, in which it is determined if all components of the constant section have been secured together at all of the predetermined locations. If not, the method returns to 1102. If so, however, the method proceeds from 1112 to 1114, in which the tool ring is removed from the constant section.

Referring to FIGS. 1-18, embodiments of the present disclosure provide systems and methods for efficiently manufacturing a structure, such as a constant section of the structure. The structure may be a fuselage of an aircraft. Optionally, the structure may be a body portion of various other vehicles, such as marine vessels (for example, submarines), land-based vehicles (such as portions of powered or unpowered train cars, land-based vehicles, trailers, or the like), fixed structures (such as building, light towers, underwater oil rigs), and the like.

Embodiments of the present disclosure provide systems and methods for forming a structure, such as a constant section, with a plurality of geodesic modules, each of which has the same shape and size. Each geodesic module may be formed from a plurality of frame segments, each of which has the same size and shape. In this manner, the manufacturing process is streamlined and simplified as a manufacturer does not need to locate different types of frame segments and align them in a precise manner (akin to a puzzle) to form the constant section. Instead, all of the frame segments are identical to one another. Accordingly, the time and labor costs of manufacturing are reduced.

Embodiments of the present disclosure provide a significant reduction in weight of a structure. For example, it has been found that geodesic frames are able to withstand torsion loads better than standard orthogonal structures. As such, a lighter, but stronger, geodesic frame may be used in place of heavier, orthogonal structures. Moreover, the identical geodesic modules that form the constant section provide a regular, repeating pattern over a length of the constant section. Because a geodesic curve by definition identifies the shortest distance between two points on a curved surface (and is therefore shorter than orthogonal paths), the geodesic definition of the guide curves reduces a number of fasteners (such as rivets) that are used to secure components together (in contrast to previous structures that were formed through orthogonal connections between stringers, frames, and the like). The geodesic modules form a constant section of a fuselage that uses less material, and is therefore lighter, than previous known fuselages. The resulting lighter and stronger airframe reduces fuel consumption, and therefore costs, of flights.

Certain embodiments of the present disclosure provide a system, which may include a dual function drilling and riveting tool moveably supported on one or more rails along a length of a mandrel holding the geodesic modules and body skin panels in place, such as through pneumatic suction, hydraulic or pneumatic latches, and/or the like. The mandrel may be fixed in position, and may be configured to revolve about a longitudinal axis. Rails can be positioned on both sides of fuselage panels to allow single or double-sided riveting processes. Optionally, one-sided flush head riveting may be used. Motion control of a drilling/riveting head is drastically simplified due to the motion being limited by the support rails, the angle of the fuselage barrel, and/or the drill-rivet head assembly.

Figure 19:
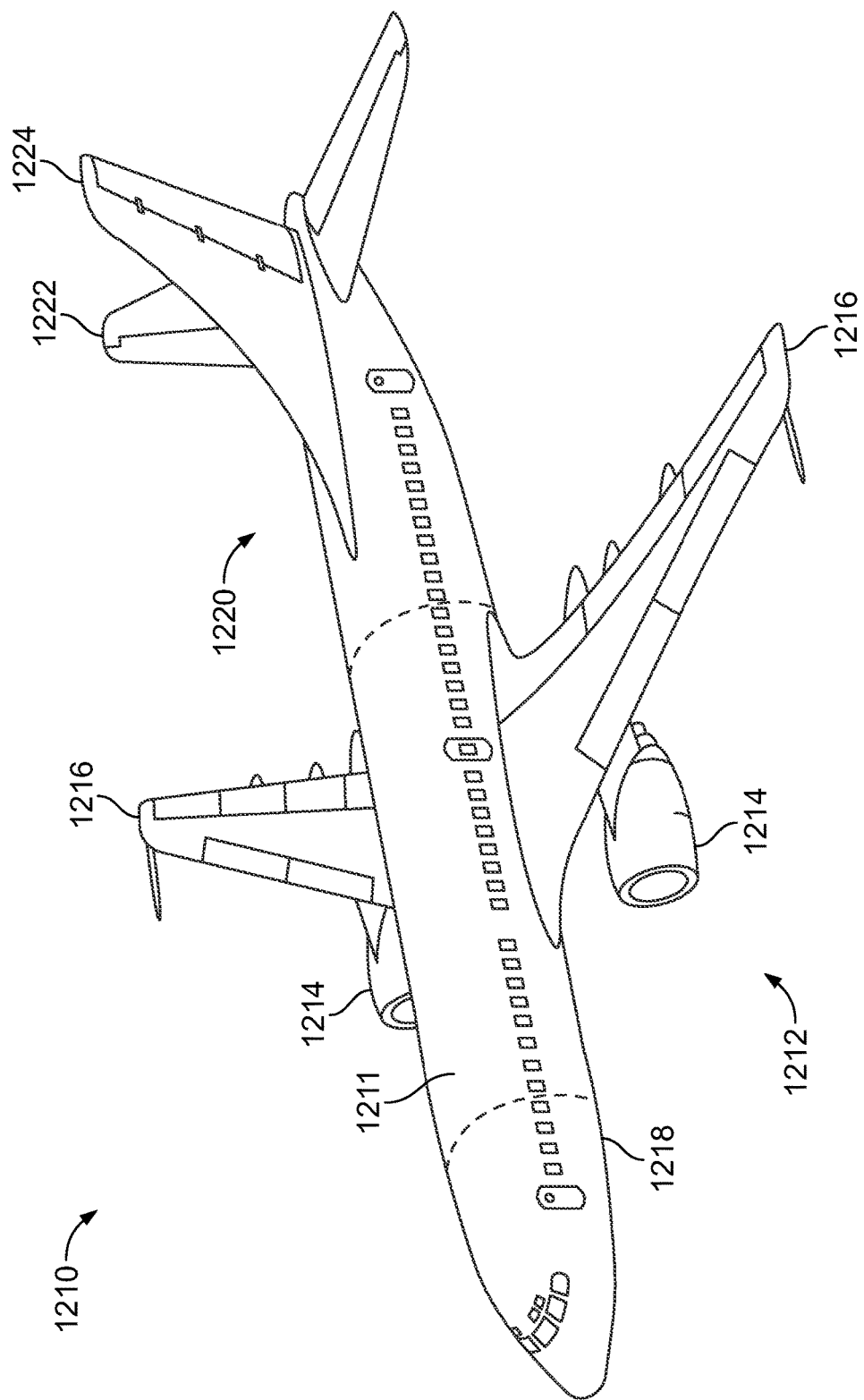
FIG. 19 is a diagrammatic representation of a perspective top view of an aircraft, according to an embodiment of the present disclosure.

FIG. 19 is a diagrammatic representation of a perspective top view of an aircraft 1210 (or aircraft assembly), according to an embodiment of the present disclosure. The aircraft 1210 is an example of a vehicle having a constant section 1211 that may be formed according to embodiments of the present disclosure. The constant section 1211 may form part of a fuselage 1218. Alternatively, instead of an aircraft, the systems and methods of embodiments of the present disclosure may be used with various other vehicles, such as automobiles, buses, locomotives and train cars, watercraft, spacecraft, and the like.

The aircraft 1210 may include a propulsion system 1212 that may include two turbofan engines 1214, for example. Optionally, the propulsion system 1212 may include more engines 1214 than shown. The engines 1214 are carried by wings 1216 of the aircraft 1210. In other embodiments, the engines 1214 may be carried by a fuselage 1218 and/or an empennage 1220. The empennage 1220 may also support horizontal stabilizers 1222 and a vertical stabilizer 1224. Alternatively, wings may be configured to replace the functionality of an empennage, such as a flying wing aircraft.

While various spatial and directional terms, such as top, bottom, lower, mid, lateral, horizontal, vertical, front and the like may be used to describe embodiments of the present disclosure, it is understood that such terms are merely used with respect to the orientations shown in the drawings. The orientations may be inverted, rotated, or otherwise changed, such that an upper portion is a lower portion, and vice versa, horizontal becomes vertical, and the like.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various embodiments of the disclosure, including the best mode, and also to enable a person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A geodesic module determination system configured to determine a size and a shape for a plurality of identical geodesic modules that are used to form a structure, the geodesic module determination system comprising:
   a control unit that executes a set of instructions stored in at least one memory to analyze input data regarding a size and a shape of the structure to be formed, and determine the size and the shape for each of the plurality of identical geodesic modules based on the size and the shape of the structure to be formed,
   wherein the control unit executes the set of instructions stored in the at least one memory to account for one or more features to be formed on or in the structure, and determine the size and the shape for each of the plurality of identical geodesic modules based on the size and the shape of the structure to be formed and the one or more features to be formed on or in the structure.

2. The geodesic module determination system of claim 1, wherein the one or more features comprises one or more windows to be formed in the structure.

3. The geodesic module determination system of claim 1, wherein the control unit executes the set of instructions stored in the at least one memory to generate a plurality of seed nodes on opposed end circles, generate mirror image geodesic curves between corresponding pairs of the seed nodes of the opposed end circles, and determine the size and shape for each of the plurality of identical geodesic modules based on the geodesic curves and intersections between the geodesic curves.

4. The geodesic module determination system of claim 3, wherein the control unit executes the set of instructions stored in the at least one memory to generate the plurality of seed nodes based, at least in part, on a size and number of features to be formed on or in the structure and a predetermined structural integrity of the structure.

5. The geodesic module determination system of claim 3, wherein the control unit executes the set of instructions stored in the at least one memory to determine a location of at least one of the plurality of seed nodes using an offset angle and a spread angle, wherein the offset angle provides a radial angle with respect to a waterline zero plane, and wherein the spread angle is a constant angle between neighboring seed nodes.

6. The geodesic module determination system of claim 1, further comprising:
   the at least one memory coupled to the control unit;
   a user interface coupled to the control unit, wherein the user interface is configured to allow an individual to enter the input data; and
   a display.

7. The geodesic module determination system of claim 1, wherein the structure comprises a framework for a constant section.

8. The geodesic module determination system of claim 7, wherein the constant section comprises a constant curvature and constant cross-sectional radius between opposed circular ends.

9. The geodesic module determination system of claim 1, wherein each of the plurality of identical geodesic modules comprises a plurality of interconnected frame segments that are identical in size and shape.

10. A method of determining a size and a shape for a plurality of identical geodesic modules that are used to form a structure, the method comprising:
    analyzing input data regarding a size and a shape of the structure to be formed;
    determining the size and the shape for each of the plurality of identical geodesic modules based on the size and the shape of the structure to be formed;
    accounting for one or more features to be formed on or in the structure; and
    determining the size and the shape for each of the plurality of identical geodesic modules based on the size and the shape of the structure to be formed and the one or more features to be formed on or in the structure.

11. The method of claim 10, wherein the one or more features comprises one or more windows to be formed in the structure.

12. The method of claim 10, wherein the determining the size and the shape for each of the plurality of identical geodesic modules comprises:
    generating a plurality of seed nodes on opposed end circles;
    generating mirror image geodesic curves between corresponding pairs of the seed nodes of the opposed end circles, and
    determining the size and shape for each of the plurality of identical geodesic modules based on the geodesic curves and intersections between the geodesic curves.

13. The method of claim 12, wherein the generating the plurality of seed nodes comprises accounting for a size and number of features to be formed on or in the structure and a predetermined structural integrity of the structure.

14. The method of claim 13, wherein the generating the plurality of seed nodes comprises determining a location of at least one of the plurality of seed nodes using an offset angle and a spread angle, wherein the offset angle provides a radial angle with respect to a waterline zero plane, and wherein the spread angle is a constant angle between neighboring seed nodes.

15. The method of claim 10, wherein the structure comprises a framework for a constant section.

16. The method of claim 15, wherein the constant section comprises a constant curvature and constant cross-sectional radius between opposed circular ends.

17. The method of claim 10, wherein each of the plurality of identical geodesic modules comprises a plurality of interconnected frame segments that are identical in size and shape.

18. A geodesic module determination system configured to determine a size and a shape for a plurality of identical geodesic modules that are used to form a structure, the geodesic module determination system comprising:
    a control unit that executes a set of instructions stored in at least one memory to analyze input data regarding a size and a shape of the structure to be formed, and determine the size and the shape for each of the plurality of identical geodesic modules based on the size and the shape of the structure to be formed,
    wherein the control unit executes the set of instructions stored in the at least one memory to generate a plurality of seed nodes on opposed end circles, generate mirror image geodesic curves between corresponding pairs of the seed nodes of the opposed end circles, and determine the size and shape for each of the plurality of identical geodesic modules based on the geodesic curves and intersections between the geodesic curves.

19. The geodesic module determination system of claim 18, wherein the control unit executes the set of instructions stored in the at least one memory to generate the plurality of seed nodes based, at least in part, on a size and number of features to be formed on or in the structure and a predetermined structural integrity of the structure.

20. The geodesic module determination system of claim 18, wherein the control unit executes the set of instructions stored in the at least one memory to determine a location of at least one of the plurality of seed nodes using an offset angle and a spread angle, wherein the offset angle provides a radial angle with respect to a waterline zero plane, and wherein the spread angle is a constant angle between neighboring seed nodes.

21. A method of determining a size and a shape for a plurality of identical geodesic modules that are used to form a structure, the method comprising:
analyzing input data regarding a size and a shape of the structure to be formed; and
determining the size and the shape for each of the plurality of identical geodesic modules based on the size and the shape of the structure to be formed, wherein the determining the size and the shape for each of the plurality of identical geodesic modules comprises:
generating a plurality of seed nodes on opposed end circles;
generating mirror image geodesic curves between corresponding pairs of the seed nodes of the opposed end circles, and
determining the size and shape for each of the plurality of identical geodesic modules based on the geodesic curves and intersections between the geodesic curves.

22. The method of claim 21, wherein the generating the plurality of seed nodes comprises accounting for a size and number of features to be formed on or in the structure and a predetermined structural integrity of the structure.

23. The method of claim 22, wherein the generating the plurality of seed nodes comprises determining a location of at least one of the plurality of seed nodes using an offset angle and a spread angle, wherein the offset angle provides a radial angle with respect to a waterline zero plane, and wherein the spread angle is a constant angle between neighboring seed nodes.

* * * * *